United States Patent
Coene

(10) Patent No.: US 6,469,645 B2
(45) Date of Patent: Oct. 22, 2002

(54) METHOD OF CONVERTING A STREAM OF DATABITS OF A BINARY INFORMATION SIGNAL INTO A STREAM OF DATABITS OF A CONSTRAINED BINARY CHANNEL SIGNAL, DEVICE FOR ENCODING, SIGNAL COMPRISING A STREAM OF DATABITS OF A CONSTRAINED BINARY CHANNEL SIGNAL, RECORD CARRIER AND DEVICE FOR DECODING

(75) Inventor: Willem Marie Julia Marcel Coene, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/757,119

(22) Filed: Jan. 8, 2001

(65) Prior Publication Data

US 2001/0022554 A1 Sep. 20, 2001

(30) Foreign Application Priority Data

Jan. 7, 2000 (EP) .............................................. 00200058
Mar. 1, 2000 (EP) .............................................. 00200712

(51) Int. Cl.$^7$ ................................................ H03M 7/00
(52) U.S. Cl. ........................................... 341/59; 341/50
(58) Field of Search .............................. 341/58, 59, 65, 341/67, 50

(56) References Cited

U.S. PATENT DOCUMENTS 5,696,505 A * 12/1997 Schouhamer Immink .... 341/59
6,084,536 A *  7/2000 Arts ............................. 341/58
6,134,220 A * 10/2000 Le Strat et al. ............. 370/252

OTHER PUBLICATIONS

"Coding Method According to Which N–bit Information Words are Alternately . . . " Research Disclosure, Kenneth Mason Publications, Hampshire, GB No. 333, 1992, p. 32.

* cited by examiner

Primary Examiner—Peguy JeanPierre
(74) Attorney, Agent, or Firm—Michael E. Belk

(57) ABSTRACT

A method of converting a stream of databits of a binary information signal into a stream of databits of a constrained binary channel signal. This stream of databits of the information signal is divided into n-bit information words. These information words are converted into $m_1$-bit channel words in accordance with a channel code $C_1$, or $m_2$-bit channel words in accordance with a channel code $C_2$, where $m_1$, $m_2$, and n are intergers such that $m_2 > m_1 \geq n$. The $m_2$-bit channel word is chosen from of at least two $m_2$-bit channel words, at least two of which have opposite parities. The concatenated $m_1$-bit channel words and the $m_2$-bit channel words comply with a runlength constraint of the constrained binary channel signal. The constrained binary channel signal may be recorded on a record carrier.

22 Claims, 38 Drawing Sheets

| state | words IN | words OUT |
|---|---|---|
| 1 | $-10^2\|$<br>$-10^3\|$<br>$-10^4\|$<br>$-10^5\|$<br>$-10^6\|$<br>$-10^7\|$<br>$-10^8\|$<br>$-10^9\|$<br>$-10^{10}\|$ | $\|10^21-$<br>$\|10^31-$<br>$\|10^41-$<br>$\|10^81-$<br>$\|10^91-$ |
| 2 | $-10^2\|$<br>$-10^3\|$<br>$-10^4\|$<br>$-10^5\|$<br>$-10^6\|$<br>$-10^7\|$<br>$-10^8\|$<br>$-10^9\|$ | $\|10^51-$<br>$\|10^61-$<br>$\|10^71-$<br>$\|010^31-$<br>$\|010^41-$<br>$\|010^51-$<br>$\|010^61-$<br>$\|010^71-$<br>$\|010^81-$<br>$\|010^91-$<br>$\|010^{10}1-$ |
| 3 | $-10^2\|$<br>$-10^3\|$<br>$-10^4\|$<br>$-10^5\|$<br>$-10^6\|$<br>$-10^7\|$<br>$-10^8\|$ | $\|10^{10}1-$<br>$\|010^21-$<br>$\|0^21-$ |
| 4 | $-1\|$<br>$-10^1\|$<br>$-10^2\|$<br>$-10^3\|$<br>$-10^4\|$<br>$-10^5\|$ | $\|0^31-$<br>$\|0^41-$<br>$\|0^51-$ |
| 5 | $-1\|$<br>$-10^1\|$ | $\|0^21-$<br>$\|0^61-$<br>$\|0^71-$<br>$\|0^81-$ |
| 6 | $-10^1\|$ | $\|0^11-$<br>$\|0^91-$ |

FIG. 2

| state | words IN | words OUT |
|---|---|---|
| 1 | $-10^2\|$<br>$-10^3\|$<br>$-10^4\|$<br>$-10^5\|$<br>$-10^6\|$<br>$-10^7\|$<br>$-10^8\|$<br>$-10^9\|$<br>$-10^{10}\|$ | $\|10^21-$<br>$\|10^31-$<br>$\|10^41-$<br>$\|10^81-$<br>$\|10^91-$ |
| 2 | $-10^2\|$<br>$-10^3\|$<br>$-10^4\|$<br>$-10^5\|$<br>$-10^6\|$<br>$-10^7\|$<br>$-10^8\|$<br>$-10^9\|$ | $\|10^51-$<br>$\|10^61-$<br>$\|10^71-$<br>$\|10^{10}1-$<br>$\|010^31-$<br>$\|010^41-$<br>$\|010^51-$<br>$\|010^61-$<br>$\|010^71-$<br>$\|010^81-$<br>$\|010^91-$<br>$\|010^{10}1-$ |
| 3 | $-10^2\|$<br>$-10^3\|$<br>$-10^4\|$<br>$-10^5\|$<br>$-10^6\|$<br>$-10^7\|$<br>$-10^8\|$ | $\|010^21-$<br>$\|0^21-$, but not: $\|0^210^710^21-$ |
| 4 | $-1\|$<br>$-10^1\|$<br>$-10^2\|$<br>$-10^3\|$<br>$-10^4\|$<br>$-10^5\|$ | $\|0^210^710^21-$<br>$\|0^31-$<br>$\|0^41-$<br>$\|0^51-$ |
| 5 | $-1\|$<br>$-10^1\|$ | $\|0^21-$, but not: $\|0^210^710^21-$<br>$\|0^61-$<br>$\|0^71-$<br>$\|0^81-$ |
| 6 | $-10^1\|$ | $\|0^11-$<br>$\|0^91-$ |

FIG. 3

| FIG. 4A |
|---------|
| FIG. 4B |
| FIG. 4C |
| FIG. 4D |
| FIG. 4E |
| FIG. 4F |
| FIG. 4G |
| FIG. 4H |
| FIG. 4I |

| | | | | | | |
|---|---|---|---|---|---|---|
| 30 | 100100010010001 | 4 | 100000100000100 | 3 | 010010001000010 | 6 | 000100100000100 | 3 | 000000100000000 | 3 | 010010001000010 | 6 |
| 31 | 100100010010001 | 5 | 100000100000100 | 4 | 010010001000001 | 4 | 000100100000100 | 4 | 000000100010010 | 4 | 010010001000001 | 4 |
| 32 | 100100010010000 | 1 | 100000100000010 | 4 | 010010001000001 | 5 | 000100100000010 | 4 | 000000100010010 | 5 | 010010001000001 | 5 |
| 33 | 100100010010000 | 2 | 100000100000010 | 5 | 010010001000000 | 1 | 000100100000010 | 5 | 000000100010010 | 6 | 010010001000000 | 1 |
| 34 | 100100010010000 | 3 | 100000100000010 | 6 | 010010001000000 | 2 | 000100100000010 | 6 | 000000100010001 | 4 | 010010001000000 | 2 |
| 35 | 100100010010000 | 4 | 100000100000001 | 4 | 010010001000000 | 3 | 000100100000001 | 4 | 000000100010001 | 5 | 010010001000000 | 3 |
| 36 | 100100010001001 | 4 | 100000100000001 | 5 | 010010000100100 | 1 | 000100100000001 | 5 | 000000100010000 | 1 | 010010000100100 | 1 |
| 37 | 100100010001001 | 5 | 100000100000001 | 6 | 010010000100100 | 2 | 000100100000000 | 1 | 000000100010000 | 2 | 010010000100100 | 2 |
| 38 | 100100010001000 | 1 | 100000100000000 | 2 | 010010000100100 | 3 | 000100100000000 | 2 | 000000100010000 | 3 | 010010000100100 | 3 |
| 39 | 100100010001000 | 2 | 100000100000000 | 3 | 010010000100010 | 4 | 000100100000000 | 3 | 000000100010000 | 4 | 010010000100010 | 4 |
| 40 | 100100010001000 | 3 | 100000100000000 | 4 | 010010000100010 | 4 | 000100100000000 | 4 | 000000100001001 | 4 | 010010000100010 | 4 |
| 41 | 100100010001000 | 4 | 100000010010010 | 4 | 010010000100010 | 5 | 000100100010010 | 4 | 000000100001001 | 5 | 010010000100010 | 5 |
| 42 | 100100010000100 | 1 | 100000010010010 | 5 | 010010000100010 | 6 | 000100100010010 | 5 | 000000100001000 | 1 | 010010000100010 | 6 |
| 43 | 100100010000100 | 2 | 100000010010010 | 6 | 010010000100001 | 4 | 000100100010010 | 6 | 000000100001000 | 2 | 010010000100001 | 4 |
| 44 | 100100010000100 | 3 | 100000010010001 | 4 | 010010000100001 | 5 | 000100100010001 | 4 | 000000100001000 | 3 | 010010000100001 | 5 |
| 45 | 100100010000100 | 4 | 100000010010001 | 5 | 010010000100000 | 1 | 000100100010001 | 5 | 000000100001000 | 4 | 010010000100000 | 1 |
| 46 | 100100010000010 | 4 | 100000010010000 | 1 | 010010000100000 | 2 | 000100100010000 | 1 | 000000100000100 | 2 | 010010000100000 | 2 |
| 47 | 100100010000010 | 5 | 100000010010000 | 2 | 010010000100000 | 3 | 000100100010000 | 2 | 000000100000100 | 3 | 010010000100000 | 3 |
| 48 | 100100010000010 | 6 | 100000010010000 | 3 | 010010000100000 | 4 | 000100100010000 | 3 | 000000100000100 | 4 | 010010000100000 | 4 |
| 49 | 100100010000001 | 4 | 100000010010000 | 4 | 010010000010010 | 4 | 000100100010000 | 4 | 000000100000100 | 5 | 010010000010010 | 4 |
| 50 | 100100010000001 | 5 | 100000010001001 | 4 | 010010000010010 | 5 | 000100100001001 | 4 | 000000100000010 | 2 | 010010000010010 | 5 |
| 51 | 100100010000000 | 1 | 100000010001001 | 5 | 010010000010010 | 6 | 000100100001001 | 5 | 000000100000010 | 3 | 010010000010010 | 6 |
| 52 | 100100010000000 | 2 | 100000010001000 | 1 | 010010000010001 | 4 | 000100100001000 | 1 | 000000100000010 | 4 | 010010000010001 | 4 |
| 53 | 100100010000000 | 3 | 100000010001000 | 2 | 010010000010001 | 5 | 000100100001000 | 2 | 000000100000010 | 5 | 010010000010001 | 5 |
| 54 | 100100001001001 | 4 | 100000010001000 | 3 | 010010000010000 | 1 | 000100100001000 | 3 | 000000100000001 | 4 | 010010000010000 | 1 |
| 55 | 100100001001001 | 5 | 100000010001000 | 4 | 010010000010000 | 2 | 000100100001000 | 4 | 000000100000001 | 5 | 010010000010000 | 2 |
| 56 | 100100001001000 | 1 | 100000010000100 | 2 | 010010000010000 | 3 | 000100100000100 | 2 | 000000100000000 | 2 | 010010000010000 | 3 |
| 57 | 100100001001000 | 2 | 100000010000100 | 3 | 010010000010000 | 4 | 000100100000100 | 3 | 000000100000000 | 3 | 010010000010000 | 4 |
| 58 | 100100001001000 | 3 | 100000010000100 | 4 | 010010000001001 | 4 | 000100100000100 | 4 | 000000010010010 | 4 | 010010000001001 | 4 |
| 59 | 100100001001000 | 4 | 100000010000100 | 5 | 010010000001001 | 5 | 000100100000010 | 4 | 000000010010010 | 5 | 010010000001001 | 5 |

FIG. 4B

| | | | | | |
|---|---|---|---|---|---|
| 60 | 100100001000100 1 | 100000010000010 5 | 010010000001000 1 | 000100010000010 5 | 000000001001000 5 | 010010000001000 1 |
| 61 | 100100001000100 2 | 100000010000010 6 | 010010000001000 2 | 000100010000010 6 | 000000001001000 6 | 010010000001000 2 |
| 62 | 100100001000100 3 | 100000010000010 4 | 010010000001000 3 | 000100010000001 4 | 000000001001000 4 | 010010000001000 3 |
| 63 | 100100001000100 4 | 100000010000001 5 | 010010000001000 4 | 000100010000001 5 | 000000001001000 5 | 010010000001000 4 |
| 64 | 100100001000010 4 | 100000010000000 1 | 010010000000100 1 | 000100010000000 1 | 000000001000100 1 | 010010000000100 1 |
| 65 | 100100001000010 5 | 100000010000000 2 | 010010000000100 2 | 000100010000000 2 | 000000001000100 2 | 010010000000100 2 |
| 66 | 100100001000010 6 | 100000010000000 3 | 010010000000100 3 | 000100010000000 3 | 000000001000100 3 | 010010000000100 3 |
| 67 | 100100001000010 4 | 100000010000000 4 | 010010000000100 4 | 000100010000000 4 | 000000001000100 4 | 010010000000100 4 |
| 68 | 100100001000001 5 | 100000001001001 5 | 010010000001001 5 | 000100001001001 5 | 000000001000010 4 | 010010000000010 4 |
| 69 | 100100001000001 1 | 100000001001001 1 | 010010000001001 1 | 000100001001001 1 | 000000001000010 5 | 010010000000010 5 |
| 70 | 100100001000000 2 | 100000001001000 2 | 010010000001000 2 | 000100001001000 2 | 000000001000010 6 | 010010000000010 6 |
| 71 | 100100001000000 3 | 100000001001000 3 | 010010000001000 3 | 000100001001000 3 | 000000001000010 4 | 010010000000010 4 |
| 72 | 100100000100100 1 | 100000001001000 4 | 010010000001000 4 | 000100001001000 4 | 000000001000001 5 | 010010000000001 5 |
| 73 | 100100000100100 2 | 100000001001000 1 | 010010000001000 1 | 000100001001000 1 | 000000001000100 1 | 010010000000000 1 |
| 74 | 100100000100100 3 | 010001001001001 2 | 010001001001001 2 | 000100001001000 2 | 000000001000100 2 | 010010000000000 2 |
| 75 | 100100000100100 4 | 010001001001001 5 | 010001001001001 5 | 000100001001000 3 | 000000001000100 3 | 010001001001001 5 |
| 76 | 100100000100010 4 | 010001001001000 1 | 010001001001000 1 | 000100001001000 4 | 001000000000100 1 | 010001001001000 1 |
| 77 | 100100000100010 5 | 010001001001000 2 | 010001001001000 2 | 000100001000100 2 | 001000000000100 2 | 010001001001000 2 |
| 78 | 100100000100010 6 | 010001001001000 3 | 010001001001000 3 | 000100001000100 3 | 000000000000010 4 | 010001001001000 3 |
| 79 | 100100000100010 4 | 010001001001000 4 | 010001001001000 4 | 000100001000100 4 | 000000000000010 5 | 010001001001000 4 |
| 80 | 100100000100001 5 | 010001001000100 1 | 010001001000100 1 | 000100001000100 1 | 000000000000010 6 | 010001001000100 1 |
| 81 | 100100000100001 1 | 010001001000100 2 | 010001001000100 2 | 000100001000100 2 | 000100010100100 1 | 010001001000100 2 |
| 82 | 100100000100000 2 | 010001001000100 3 | 010001001000100 3 | 000100001000100 3 | 000100010100100 2 | 010001001000100 3 |
| 83 | 100100000100000 3 | 010001001000100 4 | 010001001000100 4 | 000100001000100 4 | 000100010100100 3 | 010001001000100 4 |
| 84 | 100100000100000 4 | 010001001000010 4 | 010001001000010 4 | 000100001000010 4 | 000000010100010 4 | 010001001000010 4 |
| 85 | 100100000010010 5 | 100000000000010 5 | 010001001000010 5 | 000100001000010 5 | 000000010100010 5 | 010001001000010 5 |
| 86 | 100100000010010 6 | 001001001000010 6 | 010001001000010 6 | 000100001000010 6 | 000000010100010 6 | 010001001000010 6 |
| 87 | 100100000010010 4 | 001001001000010 4 | 010001001000010 4 | 000100001000100 3 | 000000010100010 4 | 010001001000010 4 |
| 88 | 100100000010001 5 | 001001001000001 5 | 010001001000001 5 | 000100001000001 4 | 000000010100001 5 | 010001001000001 5 |
| 89 | 100100000010001 1 | 001001001000000 1 | 010001001000000 1 | 000100001000000 4 | 000000010100010 4 | 010001001000000 1 |

FIG. 4C

| | | | | | |
|---|---|---|---|---|---|
| 90 | 1001000000010000 1 | 0100010010000000 2 | 0010010100100000 2 | 0001000000100010 5 | 0010010010000100 1 | 0100010010000000 2 |
| 91 | 1001000000010000 2 | 0100010010000000 3 | 0010010010000000 3 | 0001000000100010 6 | 0010010010000100 2 | 0100010010000000 3 |
| 92 | 1001000000010000 3 | 0100010001000100 1 | 0010010010000100 1 | 0001000000100001 4 | 0010010010000100 3 | 0100010010000100 1 |
| 93 | 1001000000010000 4 | 0100010001000100 2 | 0010010010000100 2 | 0001000000100001 5 | 0010010010000100 4 | 0100010010000100 2 |
| 94 | 1001000000001001 4 | 0100010001000100 3 | 0010010010000100 3 | 0001000000100000 1 | 0010010010000010 4 | 0100010010000100 3 |
| 95 | 1001000000001001 5 | 0100010001000100 4 | 0010010010000100 4 | 0001000000100000 2 | 0010010010000010 5 | 0100010010000100 4 |
| 96 | 1001000000001000 1 | 0100010001000010 4 | 0010010010000010 4 | 0001000000100000 3 | 0010010010000001 5 | 0100010010000010 4 |
| 97 | 1001000000001000 2 | 0100010001000010 5 | 0010010010000010 5 | 0001000000100000 4 | 0010010010000001 6 | 0100010010000010 5 |
| 98 | 1001000000001000 3 | 0100010001000010 6 | 0010010010000001 6 | 0001000000100000 3 | 0010010010000000 4 | 0100010010000001 6 |
| 99 | 1001000000001000 4 | 0100010001000001 4 | 0010010001000010 4 | 0001000000010010 4 | 0010010001000010 4 | 0100010010000001 4 |
| 100 | 1001000000000100 1 | 0100010001000001 5 | 0010010001000010 5 | 0001000000010010 5 | 0010010001000010 5 | 0100010001000010 5 |
| 101 | 1001000000000100 2 | 0100010001000000 1 | 0010010001000000 1 | 0001000000010001 1 | 0010010001000000 1 | 0100010001000000 1 |
| 102 | 1001000000000100 3 | 0100010001000000 2 | 0010010001000000 2 | 0001000000010001 2 | 0010010001000000 2 | 0100010001000000 2 |
| 103 | 1001000000000100 4 | 0100010001000000 3 | 0010010001000000 3 | 0001000000010000 3 | 0010010001000000 3 | 0100010001000000 3 |
| 104 | 1001000000000010 4 | 0100010001000000 4 | 0010010001000000 4 | 0001000000010000 4 | 0010010001000000 4 | 0100010001000000 4 |
| 105 | 1001000000000010 5 | 0100010000100010 4 | 0010010000100100 4 | 0001000000001001 4 | 0010010000100100 4 | 0100010000100100 4 |
| 106 | 1001000000000010 6 | 0100010000100010 5 | 0010010000100100 5 | 0001000000001001 5 | 0010010000100100 5 | 0100010000100100 5 |
| 107 | 1001000000000001 4 | 0100010000100010 6 | 0010010000100010 6 | 0001000000001000 1 | 0010010000100010 6 | 0100010000100010 6 |
| 108 | 1001000000000001 5 | 0100010000100001 4 | 0010010000100001 4 | 0001000000001000 2 | 0010010000100001 4 | 0100010000100001 4 |
| 109 | 1000100010010010 4 | 0100010000100000 1 | 0010010000100000 1 | 0001000000001000 3 | 0010010000100000 1 | 0100010000100000 1 |
| 110 | 1000100010010010 5 | 0100010000100000 2 | 0010010000100000 2 | 0001000000001000 4 | 0010010000100000 2 | 0100010000100000 2 |
| 111 | 1000100010010010 6 | 0100010000100000 3 | 0010010000100000 3 | 0001000000000100 1 | 0010010000100000 3 | 0100010000100000 3 |
| 112 | 1000100010010001 4 | 0100010000100000 4 | 0010010000100000 4 | 0001000000000100 2 | 0010010000100000 4 | 0100010000100000 4 |
| 113 | 1000100010010001 5 | 0100010000010010 4 | 0010010000010010 4 | 0001000000000100 3 | 0010010000010010 4 | 0100010000010010 4 |
| 114 | 1000100010010000 1 | 0100010000010001 1 | 0010010000010001 1 | 0001000000000100 4 | 0010010000010010 5 | 0100010000010001 1 |
| 115 | 1000100010010000 2 | 0100010000010001 2 | 0010010000010001 2 | 0001000000000010 4 | 0010010000010010 6 | 0100010000001001 5 |
| 116 | 1000100010010000 3 | 0100010000010000 3 | 0010010000001001 4 | 0001000000000010 5 | 0010010000001010 4 | 0100010000001000 1 |
| 117 | 1000100010010000 4 | 0100010000001000 4 | 0010010000001000 4 | 0001000000000010 6 | 0010010000010010 4 | 0100010000001000 2 |
| 118 | 1000100010001001 4 | 0100010000001000 4 | 0010010000001001 5 | 0001000000000010 4 | 0010010000001001 4 | 0100010000001000 3 |
| 119 | 1000100010001001 5 | 0100010000001000 4 | 0010010000001001 6 | 0001000000000010 5 | 0010010000001001 5 | 0100010000001000 4 |

FIG. 4D

| | | | | | |
|---|---|---|---|---|---|
|120|1000100100001000 1|0100010000000100 1|0001000000000001 4|0010010000010000 1|0100010000000100 1|
|121|1000100100001000 2|0100010000000100 2|0001000000000001 5|0010010000010000 2|0100010000000100 2|
|122|1000100100001000 3|0100010000000100 3|0000100100010010 4|0010010000010000 3|0100010000000100 3|
|123|1000100100001000 4|0100010000000100 4|0000100100010010 5|0010010000010000 4|0100010000000100 4|
|124|1000100100000100 1|0100010000000010 1|0000100100010010 6|0010010000001001 4|0100010000000010 4|
|125|1000100100000100 2|0100010000000010 2|0000100100010001 4|0010010000001001 5|0100010000000010 5|
|126|1000100100000100 3|0100010000000010 3|0000100100010001 5|0010010000001000 1|0100010000000010 6|
|127|1000100100000100 4|0100010000000001 4|0000100100010000 1|0010010000001000 2|0100010000000001 4|
|128|1000100100000010 4|0100010000000001 5|0000100100010000 2|0010010000001000 3|0100010000000001 5|
|129|1000100100000010 5|0100010000000001 6|0000100100010000 3|0010010000000100 1|0100010000000000 1|
|130|1000100100000010 6|0100000100000000 4|0000100100001000 4|0010010000000100 2|0100010000000000 2|
|131|1000100100000001 4|0100000100000001 5|0000100100001001 2|0010010000000100 3|0100000100000000 1|
|132|1000100100000001 5|0100000100100100 1|0000100100001001 3|0010010000000100 4|0100000100100100 2|
|133|1000100100000000 1|0100000100100100 2|0000100100001000 4|0010010000000010 4|0100000100100100 3|
|134|1000100100000000 2|0100000100100100 3|0000100100001000 5|0010010000000010 5|0100000100100100 4|
|135|1000100100000000 3|0100000100100100 4|0000100100001000 6|0010010000000010 6|0100000100100100 4|
|136|1000100100010010 4|0100000100100010 4|0000100100001000 4|0010010000000001 4|0100000100100010 4|
|137|1000100100001001 5|0100000100100010 5|0000100100001000 5|0010010000000001 5|0100000100100010 5|
|138|1000100100001001 1|0100000100100001 1|0000100100001000 1|0010010000000000 1|0100000100100001 1|
|139|1000100100001000 2|0100000100100001 2|0000100100001000 2|0010010000000000 2|0100000100100001 2|
|140|1000100100001000 3|0100000100100000 3|0000100100001000 3|0010000100100100 3|0100000100100000 3|
|141|1000100100001000 4|0100000100100000 4|0000100100000010 4|0010000100100100 4|0100000100100000 4|
|142|1000100100001000 1|0100000100100000 1|0000100100000010 5|0010000100100100 2|0100000100100000 2|
|143|1000100100001000 2|0100000100100100 2|0000100100000001 4|0010000100100100 3|0100000100100000 3|
|144|1000100100001000 3|0100000100100100 3|0000100100000001 4|0010000100100100 4|0100000100100000 4|
|145|1000100100001000 4|0100000100100100 4|0000100100000001 5|0010000100100010 4|0100000100100100 4|
|146|1000100100001000 5|0100000100100100 5|0000100100000000 1|0010000100100010 5|0100000100100010 5|
|147|1000100100001000 6|0100000100100010 6|0000100100000000 2|0010000100100010 6|0100000100100010 6|
|148|1000100100001000 4|0100000100100010 4|0000100100000000 3|0010000100100001 4|0100000100100001 4|
|149|1000100100001000 1|0100000100010000 1|0000100100001001 4|0010000100100001 5|0100000100010000 5|

FIG. 4E

| | | | | | | | | | | | | |
|---|---|---|---|---|---|---|---|---|---|---|---|---|
| 150 | 100010001000001 | 5 | 010000100010000 | 2 | 001000100100000 | 1 | 000010001001001 | 5 | 001000100100000 | 1 | 010000100010000 | 2 |
| 151 | 100010001000000 | 1 | 010000100010000 | 3 | 001000100100000 | 2 | 000010001001000 | 1 | 001000100100000 | 2 | 010000100010000 | 3 |
| 152 | 100010001000000 | 2 | 010000100010000 | 4 | 001000100100000 | 3 | 000010001001000 | 2 | 001000100100000 | 3 | 010000100010000 | 4 |
| 153 | 100010001000000 | 3 | 010000100001001 | 4 | 001000100100000 | 4 | 000010001001000 | 3 | 001000100100000 | 4 | 010000100001001 | 4 |
| 154 | 100010000100100 | 1 | 010000100001001 | 5 | 001000100010010 | 4 | 000010001001000 | 4 | 001000100010010 | 4 | 010000100001001 | 5 |
| 155 | 100010000100100 | 2 | 010000100001000 | 1 | 001000100010010 | 5 | 000010001000100 | 1 | 001000100010010 | 5 | 010000100001000 | 1 |
| 156 | 100010000100100 | 3 | 010000100001000 | 2 | 001000100010010 | 6 | 000010001000100 | 2 | 001000100010010 | 6 | 010000100001000 | 2 |
| 157 | 100010000100100 | 4 | 010000100001000 | 3 | 001000100010001 | 4 | 000010001000100 | 3 | 001000100010001 | 4 | 010000100001000 | 3 |
| 158 | 100010000100010 | 4 | 010000100001000 | 4 | 001000100010001 | 5 | 000010001000100 | 4 | 001000100010001 | 5 | 010000100001000 | 4 |
| 159 | 100010000100010 | 5 | 010000100000100 | 1 | 001000100010000 | 1 | 000010001000010 | 4 | 001000100010000 | 1 | 010000100000100 | 1 |
| 160 | 100010000100010 | 6 | 010000100000100 | 2 | 001000100010000 | 2 | 000010001000010 | 5 | 001000100010000 | 2 | 010000100000100 | 2 |
| 161 | 100010000100001 | 4 | 010000100000100 | 3 | 001000100010000 | 3 | 000010001000010 | 6 | 001000100010000 | 3 | 010000100000100 | 3 |
| 162 | 100010000100001 | 5 | 010000100000100 | 4 | 001000100010000 | 4 | 000010001000001 | 4 | 001000100010000 | 4 | 010000100000100 | 4 |
| 163 | 100010000100000 | 1 | 010000100000010 | 4 | 001000100001001 | 4 | 000010001000001 | 5 | 001000100001001 | 4 | 010000100000010 | 4 |
| 164 | 100010000100000 | 2 | 010000100000010 | 5 | 001000100001001 | 5 | 000010001000000 | 1 | 001000100001001 | 5 | 010000100000010 | 5 |
| 165 | 100010000100000 | 3 | 010000100000010 | 6 | 001000100001000 | 1 | 000010001000000 | 2 | 001000100001000 | 1 | 010000100000010 | 6 |
| 166 | 100010000100000 | 4 | 010000100000001 | 4 | 001000100001000 | 2 | 000010001000000 | 3 | 001000100001000 | 2 | 010000100000001 | 4 |
| 167 | 100010000010010 | 4 | 010000100000001 | 5 | 001000100001000 | 3 | 000010000100100 | 1 | 001000100001000 | 3 | 010000100000001 | 5 |
| 168 | 100010000010010 | 5 | 010000100000000 | 1 | 001000100001000 | 4 | 000010000100100 | 2 | 001000100001000 | 4 | 010000100000000 | 1 |
| 169 | 100010000010010 | 6 | 010000100000000 | 2 | 001000100000100 | 1 | 000010000100100 | 3 | 001000100000100 | 1 | 010000100000000 | 2 |
| 170 | 100010000010001 | 4 | 010000100000000 | 3 | 001000100000100 | 2 | 000010000100100 | 4 | 001000100000100 | 2 | 010000100000000 | 3 |
| 171 | 100010000010001 | 5 | 010000010010010 | 4 | 001000100000100 | 3 | 000010000100010 | 4 | 001000100000100 | 3 | 010000010010010 | 4 |
| 172 | 100010000010000 | 1 | 010000010010010 | 5 | 001000100000100 | 4 | 000010000100010 | 5 | 001000100000100 | 4 | 010000010010010 | 5 |
| 173 | 100010000010000 | 2 | 010000010010010 | 6 | 001000100000010 | 4 | 000010000100010 | 6 | 001000100000010 | 4 | 010000010010010 | 6 |
| 174 | 100010000010000 | 3 | 010000010010001 | 4 | 001000100000010 | 5 | 000010000100001 | 4 | 001000100000010 | 5 | 010000010010001 | 4 |
| 175 | 100010000010000 | 4 | 010000010010001 | 5 | 001000100000010 | 6 | 000010000100001 | 5 | 001000100000010 | 6 | 010000010010001 | 5 |
| 176 | 100010000001001 | 4 | 010000010010000 | 1 | 001000100000001 | 4 | 000010000100000 | 1 | 001000100000001 | 4 | 010000010010000 | 1 |
| 177 | 100010000001001 | 5 | 010000010010000 | 2 | 001000100000001 | 5 | 000010000100000 | 2 | 001000100000001 | 5 | 010000010010000 | 2 |
| 178 | 100010000001000 | 1 | 010000010010000 | 3 | 001000100000000 | 1 | 000010000100000 | 3 | 001000100000000 | 1 | 010000010010000 | 3 |
| 179 | 100010000001000 | 2 | 010000010010000 | 4 | 001000100000000 | 2 | 000010000100000 | 4 | 001000100000000 | 2 | 010000010010000 | 4 |

| | | | | | |
|---|---|---|---|---|---|
| 210 | 1000010001001001 1 | 0100000001000010 6 | 0010000001001000 1 | 0000010010001000 4 | 0010000001001000 1 | 0100000001000010 6 |
| 211 | 1000010001001000 2 | 0100000001000001 4 | 0010000001001000 2 | 0000010010001000 1 | 0010000001001000 2 | 0100000001000001 4 |
| 212 | 1000010001000100 3 | 0100000001000001 5 | 0010000001001000 3 | 0000010010001000 2 | 0010000001001000 3 | 0100000001000001 5 |
| 213 | 1000010001000100 4 | 0100000001000000 1 | 0010000001001000 4 | 0000010010001000 3 | 0010000001001000 4 | 0100000001000000 1 |
| 214 | 1000010001000010 4 | 0100000001000000 2 | 0010000001000100 1 | 0000010010001000 4 | 0010000001000100 1 | 0100000001000000 2 |
| 215 | 1000010001000010 5 | 0100000001000000 3 | 0010000001000100 2 | 0000010010001000 5 | 0010000001000100 2 | 0100000001000000 3 |
| 216 | 1000010001000010 6 | 0100000000100100 1 | 0010000001000100 3 | 0000010001001000 1 | 0010000001000100 3 | 0100000000100100 1 |
| 217 | 1000010001000001 4 | 0100000000100100 2 | 0010000001000100 4 | 0000010001001000 2 | 0010000001000100 4 | 0100000000100100 2 |
| 218 | 1000010001000001 5 | 0100000000100100 3 | 0010000001000010 4 | 0000010001001000 3 | 0010000001000010 4 | 0100000000100100 3 |
| 219 | 1000010001000000 1 | 0100000000100100 4 | 0010000001000010 5 | 0000010001001000 4 | 0010000001000010 5 | 0100000000100100 4 |
| 220 | 1000010001000000 2 | 0100000000100010 4 | 0010000001000010 6 | 0000010001000100 1 | 0010000001000010 6 | 0100000000100010 4 |
| 221 | 1000010001000000 3 | 0100000000100010 5 | 0010000001000001 4 | 0000010001000100 2 | 0010000001000001 4 | 0100000000100010 5 |
| 222 | 1000010001000000 4 | 0100000000100010 6 | 0010000001000001 5 | 0000010001000100 3 | 0010000001000001 5 | 0100000000100010 6 |
| 223 | 1000010001000000 5 | 0100000000100001 4 | 0010000001000000 1 | 0000010001000100 4 | 0010000001000000 1 | 0100000000100001 4 |
| 224 | 1000010000100010 4 | 0100000000100001 5 | 0010000001000000 2 | 0000010001000010 4 | 0010000001000000 2 | 0100000000100001 5 |
| 225 | 1000010000100010 5 | 0100000000100000 1 | 0010000001000000 3 | 0000010001000010 5 | 0010000001000000 3 | 0100000000100000 1 |
| 226 | 1000010000100010 6 | 0100000000100000 2 | 0010000000100100 1 | 0000010001000001 4 | 0010000000100100 1 | 0100000000100000 2 |
| 227 | 1000010000100001 4 | 0100000000100000 3 | 0010000000100100 2 | 0000010001000001 5 | 0010000000100100 2 | 0100000000100000 3 |
| 228 | 1000010000100001 5 | 0100000000100000 4 | 0010000000100100 3 | 0000010001000000 1 | 0010000000100100 3 | 0100000000100000 4 |
| 229 | 1000010000100000 1 | 0100000000010010 4 | 0010000000100100 4 | 0000010001000000 2 | 0010000000100100 4 | 0100000000010010 4 |
| 230 | 1000010000100000 2 | 0100000000010010 5 | 0010000000100010 4 | 0000010001000000 3 | 0010000000100010 4 | 0100000000010010 5 |
| 231 | 1000010000100000 3 | 0100000000010010 6 | 0010000000100010 5 | 0000010001000000 4 | 0010000000100010 5 | 0100000000010010 6 |
| 232 | 1000010000100000 4 | 0100000000010001 4 | 0010000000100010 6 | 0000010001000000 5 | 0010000000100010 6 | 0100000000010001 4 |
| 233 | 1000010000010001 4 | 0100000000010001 5 | 0010000000100001 4 | 0000010000100010 4 | 0010000000100001 4 | 0100000000010001 5 |
| 234 | 1000010000010001 5 | 0100000000010000 1 | 0010000000100001 5 | 0000010000100010 5 | 0010000000100001 5 | 0100000000010000 1 |
| 235 | 1000010000010000 1 | 0100000000010000 2 | 0010000000100000 1 | 0000010000100010 6 | 0010000000100000 1 | 0100000000010000 2 |
| 236 | 1000010000010000 2 | 0100000000010000 3 | 0010000000100000 2 | 0000010000100001 4 | 0010000000100000 2 | 0100000000010000 3 |
| 237 | 1000010000010000 3 | 0100000000010000 4 | 0010000000100000 3 | 0000010000100001 5 | 0010000000100000 3 | 0100000000010000 4 |
| 238 | 1000010000000100 1 | 0100000000001001 4 | 0010000000100000 4 | 0000010000100000 4 | 0010000000100000 4 | 0100000000001001 4 |
| 239 | 1000010000000100 2 | 0100000000001001 5 | 0010000000010010 4 | 0000010000100000 5 | 0010000000010010 4 | 0100000000001001 5 |

| Row | | | | | | |
|---|---|---|---|---|---|---|
| 17 | 100100000100100100 | 0100010010000100 | 0010010010000001000 | 0001000000001000 | 001001001000001000 | 0100010010000100 1 |
| 18 | 100100100100000100 | 0100001000000100 | 0010010000000000100 | 0001000000010001 | 001001000000001000 | 0100010000000100 1 |
| 19 | 100100000100000100 | 0100010001010000 | 0010010010010000000 | 0001000000000100 | 001001001001000000 | 0100010010000000 1 |
| 20 | 100100000000100100 | 0100010001001000 | 0010010001001001000 | 0001000001001000 | 001001000000001000 | 0100010001001000 1 |
| 21 | 100100100100100000 | 0100010010000100 | 0010010001010100000 | 0001000000010000 | 001001001000001000 | 0100010010001000 1 |
| 22 | 100100100100000000 | 0100010010010000 | 0010010000010001000 | 0001001000000100 | 001001000100000100 | 0100010000100100 1 |
| 23 | 100100100000010000 | 0100010010010000 | 0010010000100100010 | 0001000000000000 | 001001000001001000 | 0100010000010000 1 |
| 24 | 100100000000000100 | 0100010000100000 | 0010010000100001000 | 0001000001000000 | 001001000100001000 | 0100010000001000 1 |
| 25 | 100100000000010000 | 0100000100001000 | 0010010000000000000 | 0001000100000010 | 001001000000000100 | 0100010010000000 1 |
| 26 | 100100000100100000 | 0100000001001000 | 0010010010001010000 | 0001001000100000 | 001001000000100000 | 0100000010000100 1 |
| 27 | 100100100000000010 | 0100000100001000 | 0010010010000100000 | 0001001000100000 | 001001001000010000 | 0100010010000000 1 |
| 28 | 100100100000100010 | 0100000100001000 | 0010000001000000100 | 0001001000000010 | 001001001000010000 | 0100010010000100 1 |
| 29 | 100100000000001000 | 0100000010000000 | 0010000000100100000 | 0001000001010010 | 001001000000001000 | 0100010000010010 1 |
| 30 | 100100100100010000 | 0100001000010000 | 0010000001000000000 | 0001000100000000 | 001001001010001000 | 0100010000100000 1 |
| 31 | 100100100000000000 | 0100001000000000 | 0010000000000001000 | 0001000010010000 | 001001000100000100 | 0100010001000000 1 |
| 32 | 100010100000100000 | 0100000101000100 | 0010000101000000100 | 0001000010000000 | 001001001000010000 | 0100010010001000 1 |
| 33 | 100010000000010000 | 0100000001000000 | 0010000000100010000 | 0001000100010100 | 001000000100010000 | 0100000100000000 1 |

| | | | | | |
|---|---|---|---|---|---|
| 85 | 1001001000000000100 3 | 10000010000100100 3 | 0100100010010000 3 | 0001000100010000 3 | 0000001000100000 3 | 0100100010010000 3 |
| 86 | 1001001001000100 3 | 10000010000000100 3 | 0100100000100000 3 | 0001000100100000 3 | 0000001001010000 3 | 0100100001000000 3 |
| 87 | 1001001001000000 3 | 10000010010010000 3 | 0100100010000100 3 | 0001000100000100 3 | 0000001001001000 3 | 0100100001000100 3 |
| 88 | 1001001001000100 3 | 10000001001001000 3 | 0100100010000100 3 | 0001000100000100 3 | 0000001001000000 3 | 0100100000100000 3 |

(figure content — binary matrix data)

| | | | | | | |
|---|---|---|---|---|---|---|
| 119 | 100100100010001001 | 4 | 100000010010000100 | 4 | 01001001000100000 | 4 | 000100100010001000 | 4 | 000000010000001000 | 3 | 010010010000100000 | 4 |
| 120 | 100100100010001000 | 4 | 100000010010001001 | 4 | 010010010001000001 | 4 | 000100100000010000 | 4 | 000000010010000100 | 3 | 010010010000100100 | 4 |
| 121 | 100100100010000100 | 4 | 100000010010000010 | 4 | 010010010000010000 | 4 | 000100100010000100 | 4 | 000000010000000100 | 3 | 010010010000010000 | 4 |
| 122 | 100100100010000010 | 4 | 100000010001001001 | 4 | 010010010001000010 | 4 | 000100100001000010 | 4 | 000000010010000100 | 3 | 010010010000010010 | 4 |
| 123 | 100100100010000001 | 4 | 100000010001001000 | 4 | 010010010000100001 | 4 | 000100100000100000 | 4 | 000000010010000000 | 3 | 010010010000001000 | 4 |
| 124 | 100100100001000100 | 4 | 100000010001000100 | 4 | 010010010000010001 | 4 | 000100100000000001 | 4 | 001000000010001001 | 4 | 010010010000001001 | 4 |
| 125 | 100100100001000010 | 4 | 100000010001000010 | 4 | 010010001001000001 | 4 | 000100100001001000 | 4 | 000000001001001000 | 4 | 010010010000100100 | 4 |
| 126 | 100100100001000001 | 4 | 100000010001000001 | 4 | 010010001001000010 | 4 | 000100100100010000 | 4 | 000000100010001000 | 4 | 010010010000010000 | 4 |
| 127 | 100100100001000000 | 4 | 100000010000100001 | 4 | 010010001000010010 | 4 | 000100100001001000 | 4 | 000000100001001000 | 4 | 010010010000010001 | 4 |
| 128 | 100100100000100001 | 4 | 100000010000100000 | 4 | 010010001000001000 | 4 | 000100100000001000 | 4 | 000010010000010001 | 4 | 010010010000001000 | 4 |
| 129 | 100100100000100000 | 4 | 100000010000100001 | 4 | 010010001000010000 | 4 | 000100100100010000 | 4 | 000000100001000010 | 4 | 010010010000100001 | 4 |
| 130 | 100100100000010001 | 4 | 100000010000010000 | 4 | 010010001000100000 | 4 | 000100100100010000 | 4 | 000000100010000100 | 4 | 010010010000100100 | 4 |
| 131 | 100100100001000000 | 4 | 100000010000010000 | 4 | 010010001000100100 | 4 | 000100100100010000 | 4 | 000000100010000100 | 4 | 010010010010010010 | 4 |
| 132 | 100100100000000010 | 4 | 100000010000001001 | 4 | 010010000010000010 | 4 | 000100100001001000 | 4 | 000000100001000100 | 4 | 010010010010010010 | 4 |
| 133 | 100100100000000001 | 4 | 100000010000001000 | 4 | 010010001001000010 | 4 | 000100100100001000 | 4 | 000000100001000100 | 4 | 010010010001001000 | 4 |
| 134 | 100100100000100010 | 4 | 100000010000001000 | 4 | 010010000001000010 | 4 | 000100100010001001 | 4 | 000000100001000010 | 4 | 010010010010010000 | 4 |
| 135 | 100100100000010001 | 4 | 100000010000010000 | 4 | 010010000001000010 | 4 | 000100100001001000 | 4 | 000000100001000001 | 4 | 010010010000100001 | 4 |

| | | | | | | | | | | | | |
|---|---|---|---|---|---|---|---|---|---|---|---|---|
| 204 | 10010010000000010 | 5 | 10000010000001001 | 5 | 01001000000100010 | 5 | 00010001001000010 | 5 | 00000010010001001 | 5 | 01001000000100010 | 5 |
| | 10010010001000001 | 5 | 10000001000000001 | 5 | 01001000100010001 | 5 | 00010000100000001 | 5 | 00000010010000010 | 5 | 01001000100010001 | 5 |
| 205 | 10010010000000001 | 5 | 10000001001000010 | 5 | 01001000000100001 | 5 | 00010001001000001 | 5 | 00000010001001001 | 5 | 01001000000100001 | 5 |
| | 10010010000100010 | 5 | 10000000100000010 | 5 | 01001000100001001 | 5 | 00010000010000010 | 5 | 00000010010000001 | 5 | 01001000100001001 | 5 |
| 206 | 10010001001001001 | 5 | 10000001001000001 | 5 | 01001000000010010 | 5 | 00010001000100010 | 5 | 00000010000000010 | 5 | 01001000000010010 | 5 |
| | 10010010000100001 | 5 | 10000000100000001 | 5 | 01001000010010010 | 5 | 00010000010000001 | 5 | 00000010001000010 | 5 | 01001000010010010 | 5 |
| 207 | 10010001000000010 | 5 | 10000001000100010 | 5 | 01001000000010001 | 5 | 00010001000100001 | 5 | 00000010010010010 | 5 | 01001000000010001 | 5 |
| | 10010010000010010 | 5 | 10000000000100010 | 5 | 01001000010010001 | 5 | 00010000001000010 | 5 | 00000010001000001 | 5 | 01001000010010001 | 5 |
| 208 | 10010001000000001 | 5 | 10000001000100001 | 5 | 01001000000001001 | 5 | 00010001000010010 | 5 | 00000010010010001 | 5 | 01001000000001001 | 5 |
| | 10010010000010001 | 5 | 10000000000100001 | 5 | 01001000010001001 | 5 | 00010000001000001 | 5 | 00000010000100010 | 5 | 01001000010001001 | 5 |
| 209 | 10010000100000010 | 5 | 01000100100000010 | 5 | 00100100000100001 | 5 | 00010001000010001 | 5 | 00100100000100001 | 5 | 01000100100000010 | 5 |
| | 10010010000001001 | 5 | 10000010010010010 | 5 | 01001000001001001 | 5 | 00010000000100010 | 5 | 00000010000100001 | 5 | 01001000001001001 | 5 |
| 210 | 10010000100000001 | 5 | 01000100100000001 | 5 | 00100100000010010 | 5 | 00010001000001001 | 5 | 00100100000010010 | 5 | 01000100100000001 | 5 |
| | 10010001001000010 | 5 | 01000000000010010 | 5 | 01001000000000010 | 5 | 00010000000100001 | 5 | 00000010000010010 | 5 | 01001000000000010 | 5 |
| 211 | 10010000010000010 | 5 | 01000100010000010 | 5 | 00100100000010001 | 5 | 00010000100100010 | 5 | 00100100000010001 | 5 | 01000100010000010 | 5 |
| | 10010001001000001 | 5 | 01000100100100010 | 5 | 00100100010010010 | 5 | 00010000000010010 | 5 | 00100100010010010 | 5 | 01000100100100010 | 5 |
| 212 | 10010000010000001 | 5 | 01000100010000001 | 5 | 00100100000001001 | 5 | 00010000100100001 | 5 | 00100100000001001 | 5 | 01000100010000001 | 5 |
| | 10010001000100010 | 5 | 01000100100100001 | 5 | 00100100010010001 | 5 | 00010000000010001 | 5 | 00100100010010001 | 5 | 01000100100100001 | 5 |
| 213 | 10010000001000010 | 5 | 01000100001000010 | 5 | 00100010010000010 | 5 | 00010000100010010 | 5 | 00100010010000010 | 5 | 01000100001000010 | 5 |
| | 10010001000100001 | 5 | 01000100100010010 | 5 | 00100100010001001 | 5 | 00010000000001001 | 5 | 00100100010001001 | 5 | 01000100100010010 | 5 |
| 214 | 10010000001000001 | 5 | 01000100001000001 | 5 | 00100010010000001 | 5 | 00010000100010001 | 5 | 00100010010000001 | 5 | 01000100001000001 | 5 |
| | 10010001000010010 | 5 | 01000100100010001 | 5 | 00100100001001001 | 5 | 00001001000000010 | 5 | 00100100001001001 | 5 | 01000100100010001 | 5 |
| 215 | 10010000000100010 | 5 | 01000100000100010 | 5 | 00100010001000010 | 5 | 00010000100001001 | 5 | 00100010001000010 | 5 | 01000100000100010 | 5 |
| | 10010001000010001 | 5 | 01000100100001001 | 5 | 00100100000000010 | 5 | 00001001000000001 | 5 | 00100100000000010 | 5 | 01000100100001001 | 5 |
| 216 | 10010000000100001 | 5 | 01000100000100001 | 5 | 00100010001000001 | 5 | 00010000010010010 | 5 | 00100010001000001 | 5 | 01000100000100001 | 5 |
| | 10010001000001001 | 5 | 01000100010010010 | 5 | 00100100000000001 | 5 | 00001000100000010 | 5 | 00100100000000001 | 5 | 01000100010010010 | 5 |
| 217 | 10010000000010010 | 5 | 01000100000010010 | 5 | 00100010000100010 | 5 | 00010000010010001 | 5 | 00100010000100010 | 5 | 01000100000010010 | 5 |
| | 10010000100100010 | 5 | 01000100010010001 | 5 | 00100010010010010 | 5 | 00001000100000001 | 5 | 00100010010010010 | 5 | 01000100010010001 | 5 |
| 218 | 10010000000010001 | 5 | 01000100000010001 | 5 | 00100010000100001 | 5 | 00010000010001001 | 5 | 00100010000100001 | 5 | 01000100000010001 | 5 |
| | 10010000100100001 | 5 | 01000100010001001 | 5 | 00100010010010001 | 5 | 00001000010000010 | 5 | 00100010010010001 | 5 | 01000100010001001 | 5 |
| 219 | 10010000000001001 | 5 | 01000100000001001 | 5 | 00100010000010010 | 5 | 00010000001001001 | 5 | 00100010000010010 | 5 | 01000100000001001 | 5 |
| | 10010000100010010 | 5 | 01000100001001001 | 5 | 00100010010001001 | 5 | 00001000010000001 | 5 | 00100010010001001 | 5 | 01000100001001001 | 5 |
| 220 | 10001001000000010 | 5 | 01000010010000010 | 5 | 00100010000010001 | 5 | 00001001001000010 | 5 | 00100010000010001 | 5 | 01000010010000010 | 5 |
| | 10010000100010001 | 5 | 01000100000000010 | 5 | 00100010001001001 | 5 | 00001000001000010 | 5 | 00100010001001001 | 5 | 01000100000000010 | 5 |

| Present Word | Next Word | Next State | |
|---|---|---|---|
| — * * | 1 0 0 1 — | 1 | $10^2 1 —$ |
| — * * | 1 0 0 0 1 — | 1 | $10^3 1 —$ |
| — * * | 1 0 0 0 0 1 — | 1 | $10^4 1 —$ |
| — * * | 1 0 0 0 0 0 1 — | 2 | $10^5 1 —$ |
| — * * | 1 0 0 0 0 0 0 1 — | 2 | $10^6 1 —$ |
| — * * | 1 0 0 0 0 0 0 0 1 — | 2 | $10^7 1 —$ |
| — * * | 1 0 0 0 0 0 0 0 0 1 — | 1 | $10^8 1 —$ |
| — * * | 1 0 0 0 0 0 0 0 0 0 1 — | 1 | $10^9 1 —$ |
| — * * | 1 0 0 0 0 0 0 0 0 0 0 1 — | 3 | $10^{10} 1 —$ ← |
| — 0 0 | 0 1 0 0 0 — | 2 | 0 1 0 0 0 — |
| — 0 0 | 0 1 0 0 1 — | 3 | $010^2 1 —$ |
| — 1 0 | 0 1 — | 6 | 0 1 — |
| — 0 0 | 0 0 1 — | 3 | $0^2 1 —$ |
| — 0 1 | 0 0 1 — | 5 | $0^2 1 —$ |
| — 1 0 | 0 0 1 — | 5 | $0^2 1 —$ |
| — * * | 0 0 0 1 — | 4 | $0^3 1 —$ |
| — * * | 0 0 0 0 1 — | 4 | $0^4 1 —$ |
| — * * | 0 0 0 0 0 1 — | 4 | $0^5 1 —$ |
| — * * | 0 0 0 0 0 0 1 — | 5 | $0^6 1 —$ |
| — * * | 0 0 0 0 0 0 0 1 — | 5 | $0^7 1 —$ |
| — * * | 0 0 0 0 0 0 0 0 1 — | 5 | $0^8 1 —$ |
| — * * | 0 0 0 0 0 0 0 0 0 1 — | 6 | $0^9 1 —$ |
| 2 bit | 12 bit | | |

FIG. 6

| Present Word | Next Word | Next State | |
|---|---|---|---|
| $-**$ | $1001-$ | 1 | $10^21-$ |
| $-**$ | $10001-$ | 1 | $10^31-$ |
| $-**$ | $100001-$ | 1 | $10^41-$ |
| $-**$ | $1000001-$ | 2 | $10^51-$ |
| $-**$ | $10000001-$ | 2 | $10^61-$ |
| $-**$ | $100000001-$ | 2 | $10^71-$ |
| $-**$ | $1000000001-$ | 1 | $10^81-$ |
| $-**$ | $10000000001-$ | 1 | $10^91-$ |
| $-**$ | $100000000001-$ | 3 | $10^{10}1-$ |
| $-00$ | $01000-$ | 2 | $01000-$ |
| $-00$ | $01001-$ | 3 | $010^21-$ |
| $-10$ | $01-$ | 6 | $01-$ |
| $-00$ | $001-$, but not: $00100000001001-$ | 3 | $0^21-$ $0^210^710^21-$ ← |
| $-01$ | $001-$, but not: $00100000001001-$ | 5 | $0^21-$ $0^210^710^21-$ ← |
| $-10$ | $001-$, but not: $00100000001001-$ | 5 | $0^21-$ $0^210^710^21-$ ← |
| $-**$ | $0001-$ | 4 | $0^31-$ |
| $-**$ | $00001-$ | 4 | $0^41-$ |
| $-**$ | $000001-$ | 4 | $0^51-$ |
| $-**$ | $0000001-$ | 5 | $0^61-$ |
| $-**$ | $00000001-$ | 5 | $0^71-$ |
| $-**$ | $000000001-$ | 5 | $0^81-$ |
| $-**$ | $00100000001001-$ | 4 | $0^210^710^21-$ ← |
| 2 bit | 14 bit | | |

FIG. 7

17CC : 5-state FSM for Main Code $C_1$, E→E & E & Dual Code $C_2$, E→O

| state | words IN | words OUT | Fan-Out Main Code | Fan-Out Dual Code |
|---|---|---|---|---|
| 1 | $-10^2\|$<br>$-10^4\|$<br>$-10^6\|$<br>$-10^8\|$<br>$-10^{10}\|$<br>$-10^{12}\|$<br>$-10^{14}\|$ | $\|010^310^3 1-$<br>$\|010^310^5 1-$<br>$\|010^310^7 1-$<br>$\|010^310^9 1-$<br>$\|010^310^{11} 1-$<br>$\|010^310^{13} 1-$<br>$\|010^{11} 1-$<br>$\|010^{13} 1-$<br>$\|010^{15} 1-$ | 262 | 257 |
| 2 | $-10^2\|$<br>$-10^4\|$<br>$-10^6\|$<br>$-10^8\|$<br>$-10^{10}\|$<br>$-10^{12}\|$<br>$-10^{14}\|$ | $\|010^5 1-$<br>$\|010^7 1-$<br>$\|010^9 1-$<br>$\|010^310^{15} 1-$ | 263 | 257 |
| 3 | $-1\|$<br>$-10^2\|$<br>$-10^4\|$<br>$-10^6\|$<br>$-10^8\|$<br>$-10^{10}\|$<br>$-10^{12}\|$ | $\|0^310^3 1-$<br>$\|0^310^5 1-$<br>$\|0^310^7 1-$<br>$\|0^310^{13}10^5 1-$<br>$\|0^310^{13}10^6 1-$ (*)<br>$\|0^310^{13}10^7 1-$ (**) | 265 | 259 |
| 4 | $-1\|$<br>$-10^2\|$<br>$-10^4\|$<br>$-10^6\|$ | $\|0^310^9 1-$<br>$\|0^310^{11} 1-$<br>$\|0^310^{15} 1-$<br>$\|0^5 1-$ | 263 | 260 |
| 5 | $-1\|$<br>$-10^2\|$<br>$-10^4\|$ | $\|0^7 1-$<br>$\|0^9 1-$<br>$\|0^{11} 1-$<br>$\|0^310^{13}10^3 1-$ | 263 | 256 |

(*) only for Main Code
(**) only for Dual Code

FIG. 20

17CC : 7-state FSM for Main Code $C_1$, $O \rightarrow O$ & Dual Code $C_2$, $O \rightarrow E$

| state | words IN | words OUT | Fan-Out Main Code | Fan-Out Dual Code |
|---|---|---|---|---|
| 1 | $\|{-}10^3\|$<br>$\|{-}10^5\|$<br>$\|{-}10^7\|$<br>$\|{-}10^9\|$<br>$\|{-}10^{11}\|$<br>$\|{-}10^{13}\|$<br>$\|{-}10^{15}\|$ | $\|10^31\|{-}$ | 256 | 259 |
| 2 | $\|{-}10^3\|$<br>$\|{-}10^5\|$<br>$\|{-}10^7\|$<br>$\|{-}10^9\|$<br>$\|{-}10^{11}\|$<br>$\|{-}10^{13}\|$<br>$\|{-}10^{15}\|$ | $\|10^51\|{-}$<br>$\|10^71\|{-}$ | 260 | 264 |
| 3 | $\|{-}10^3\|$<br>$\|{-}10^5\|$<br>$\|{-}10^7\|$<br>$\|{-}10^9\|$<br>$\|{-}10^{11}\|$<br>$\|{-}10^{13}\|$ | $\|10^91\|{-}$<br>$\|10^{11}1\|{-}$<br>$\|10^{13}1\|{-}$<br>$\|10^{15}1\|{-}$<br>$\|0^210^51\|{-}$<br>$\|0^210^{11}1\|{-}$<br>$\|0^210^{13}1\|{-}$<br>$\|0^210^{15}1\|{-}$ | 289 | 292 |
| 4 | $\|{-}10^1\|$<br>$\|{-}10^3\|$<br>$\|{-}10^5\|$<br>$\|{-}10^7\|$ | $\|0^210^31\|{-}$<br>$\|0^210^71\|{-}$<br>$\|0^210^91\|{-}$ | 261 | 264 |
| 5 | $\|{-}10^1\|$<br>$\|{-}10^3\|$<br>$\|{-}10^5\|$<br>$\|{-}10^7\|$ | $\|0^41\|{-}$ | 256 | 259 |
| 6 | $\|{-}10^1\|$<br>$\|{-}10^3\|$<br>$\|{-}10^5\|$<br>$\|{-}10^7\|$ | $\|0^61\|{-}$<br>$\|0^81\|{-}$ | 260 | 264 |
| 7 | $\|{-}10^1\|$ | $\|0^{10}1\|{-}$<br>$\|0^{12}1\|{-}$<br>$\|0^{14}1\|{-}$<br>$\|0^210^51\|{-}$<br>$\|0^210^{11}1\|{-}$<br>$\|0^210^{13}1\|{-}$<br>$\|0^210^{15}1\|{-}$ | 273 | 272 |

FIG. 21

METHOD OF CONVERTING A STREAM OF DATABITS OF A BINARY INFORMATION SIGNAL INTO A STREAM OF DATABITS OF A CONSTRAINED BINARY CHANNEL SIGNAL, DEVICE FOR ENCODING, SIGNAL COMPRISING A STREAM OF DATABITS OF A CONSTRAINED BINARY CHANNEL SIGNAL, RECORD CARRIER AND DEVICE FOR DECODING

Method of converting a stream of databits of a binary information signal into a stream of databits of a constrained binary channel signal, device for encoding, signal comprising a stream of databits of a constrained binary channel signal, record carrier and device for decoding.

FIELD OF THE INVENTION

The invention relates to a method of converting a stream of databits of a binary information signal into a stream of databits of a constrained binary channel signal, wherein the stream of databits of the binary information signal is divided into n-bit information words, said information words being converted into $m_1$-bit channel words in accordance with a channel code $C_1$, or $m_2$-bit channel words, in accordance with a channel code $C_2$, where $m_1$, $m_2$ and n are integers for which it holds that $m_2 > m_1 \geq n$, wherein the $m_2$-bit channel word is chosen from at least two $m_2$-bit channel words, at least two of which have opposite parities, the concatenated $m_1$-bit channel words and the $m_2$-bit channel words complying with a runlength constraint of the binary channel signal.

The invention also relates to a device for encoding a stream of databits of a binary information signal into a stream of databits of a constrained binary channel signal. The invention also relates to a signal comprising a stream of databits of a constrained binary channel signal. The invention further relates to a record carrier and to a device for decoding the constrained binary channel signal.

SUMMARY OF THE INVENTION

The invention is in the field of channel coding, in particular in runlength limited channel coding. The length of time, expressed in channel bits, between consecutive signal transitions is usually called the runlength. Different constraints can be imposed on a channel code, e.g. resulting in a runlength limited channel code. In such a code, a sequence of channel words is characterized by two parameters, a d-constraint and a k-constraint. In (d,k) domain a logical "one" indicates a transition in the signal waveform. A (d,k) sequence satisfies the following two conditions: due to the d-constraint, two logic "ones" are separated by a run of at least d consecutive "zeroes"; due to the k-constraint two logic "ones" are separated by a run of at most k consecutive "zeroes". The (d,k) sequence is converted from the (d,k) domain into a runlength-limited (RLL) sequence of the type (d,k) in the RLL domain upon preceding in a 1T precoder. This RLL sequence comprises elements with runlengths (either an array of consecutive zeroes or an array of consecutive ones) of d+1 at minimum and k+1 at maximum between subsequent signal reversals in the information signal. The values of (d+1) and (k+1) indicate the minimum and maximum runlengths of the element allowed in the sequence. It is noted that the term element can be used to indicate both an element of a (d,k) sequence or an element of an RLL sequence. An element is considered to be extending over a runlength in the RLL domain or (d,k) domain.

In runlength limited channel coding, each information word is converted into a channel word according to predefined rules of conversion, these channel words forming a modulated signal.

*Research Disclosure,* January 1992, page 32, 33340, discloses a coding method according to which n-bit information words are alternately converted into $m_1$-bit channel words and $m_2$-bit channel words, where n, $m_1$ and $m_2$ are integers and $n \leq m_1 < m_2$. For each n-bit information word, there are two $m_2$-bit channel words available having mutually different disparities. A channel word is selected so that the current running digital sum in the channel signal shows a behaviour in accordance with a desired pattern as a function of time, for example a DC-free coding in the channel signal.

In other words, there are two channel codes involved in the Research Disclosure, one with an n-to-$m_1$ mapping of information words into channel words, which can be referred to as the main code $C_1$, and the other with an n-to-$m_2$ mapping, with two $m_2$-bit channel words, which can be referred to as the dual code $C_2$.

The efficiency of a channel code can be expressed by using the (information) rate of the channel code. This rate R of a channel code is defined as the quotient n/m, in which the code translated n binary user (or information) symbols into m binary channel symbols. As explained above, in runlength limited channel coding, the channel words must comply with certain constraints, for example a d-constraint and a k-constraint. Due to these restrictions; the number of bit combinations which may represent the information words is lowered and therefore the rate will decrease.

It is an object of the invention to realize an efficient method of encoding a stream of information words into a constrained stream of channel words.

The method in accordance with the invention is characterized in that the method comprises the repetitive and/or alternate steps of:

selecting the $m_1$-bit channel word from a set out of a plurality of sets of $m_1$-bit channel words, each set comprising only $m_1$-bit channel words having a beginning part out of a subset of beginning parts of the $m_1$-bit channel words, each set being associated with a coding state of channel code $C_1$, the coding state being established in dependence upon an end part of the preceding channel word.

or:

selecting the $m_2$-bit channel word from a set out of a plurality of sets of $m_2$-bit channel words, each set comprising only $m_2$-bit channel words having a beginning part out of a subset of beginning parts of the $m_2$-bit channel words belonging to said set, each set being associated with a coding state of channel code $C_2$, the coding state being established in dependence upon an end part of the preceding channel word, the end parts of the $m_1$-bit channel words in a coding state of channel code $C_1$ and the beginning parts of the $m_2$-bit channel words in a set of channel code $C_2$ being arranged to comply with said runlength constraint.

By repetitively or alternately performing said steps and by arranging the end parts of the $m_1$-bit channel words in a coding state of channel code $C_1$ and the beginning parts of the $m_2$-bit channel words in a coding state of channel code $C_2$, the beginning parts of the $m_2$-bit channel words can be applied to the coding states of channel code $C_1$, thereby realizing the constrained binary channel signal; and vice versa when arranging the end parts of the $m_2$-bit channel words and the beginning parts of the $m_1$-bit channel words.

The invention is based on the recognition that the coding states of two different channel codes can be combined by arranging the beginning parts and the end parts of the channel words of the channel codes, so that end parts in the channel code C1 match with beginning parts of the sets of $m_1$-bit channel words, but also with the beginning parts of the sets of $m_2$-bit channel words. A multiple-state description of encoder and decoder yields channel codes with high efficiency or information rate.

Another method according to the invention is characterized in that the number of coding states of channel code $C_1$ is equal to the number of coding states of channel code $C_2$.

In the case where for the dual code $C_2$, two $m_2$-bit channel words with opposite parity can be used for each n-bit information word, it is possible to use these channel words for influencing predetermined properties of the binary channel signal. In order to be able to comply with the constraints of the constrained stream of channel words, it is advantageous that the end parts of the $m_1$-bit channel words in a coding state of channel code $C_1$ and the beginning parts of the $m_2$-bit channel words in a coding state of channel code $C_2$ are arranged that the number of coding states of channel code $C_1$ is equal to the number of coding states of channel code $C_2$. In this way, the coding tables can be limited. Parts of the coding states of channel code $C_1$ can for example be similar or equal to parts of the coding states of channel code $C_2$. This results in an easier implementation of coding and decoding in hardware and/or software.

The channel codes according to the invention may be uniquely described in terms of a so-called finite-state-machine (FSM). Transitions between the states of the FSM correspond to the emission of channel words in accordance with n-bit information words that enter the encoder. This implies that—in order to have a valid code—from each state of the FSM, there must be leaving at least $2^n$ transitions towards all states of the FSM. With the FSM being in a given state, a given n-bit information word does not only determine the m-bit channel words, but also the next-state from which the next n-bit information word entering the encoder, is to be encoded.

Another method according to the invention is characterized in that the end part of any $m_1$-bit channel word has a multiplicity $y_1$, the multiplicity $y_1$ being the number of different states of the channel code $C_1$ said end part may establish, and that the end part of any $m_2$-bit channel word has a multiplicity $y_2$, the multiplicity $y_2$ being the number of states of the channel code $C_2$ said end may establish and in that $y_1=y_2$ if the end part of the $m_1$-bit channel word is equal to the end part of the $m_2$-bit channel word.

Each end part of the $m_1$-bit channel word has a multiplicity $y_1$, the multiplicity $y_1$ being the number of states of the channel code $C_1$ said end part is permitted in, and each end part of the $m_2$-bit channel word has a multiplicity $y_2$, the multiplicity $y_2$ being the number of states of the channel code $C_2$ said end part is permitted in. It is not necessary that the multiplicity of an end part of a word is used for 100%. It is advantageous that $y_1=y_2$, if the end part of the $m_1$-bit channel word is equal to the end part of the $m_2$-bit channel word. In this way the coding states of channel code $C_1$ and the coding states of channel code $C_2$ can be alternated in order that the constrained binary channel signal, comprising the concatenated $m_1$-bit channel words and the $m_2$-bit channel words, obeys a constraint of the binary channel signal. Using an equal multiplicity results in an easier implementation of coding and decoding in hardware and/or software.

Another method according to the invention is characterized in that said at least two $m_2$-bit channel words establish the same state.

We have so far defined the dual code $C_2$ as having the following properties: it is a code with n-to-$m_2$ mapping, where each n-bit information word can be represented by at least two channel words, among which at least two have opposite parities. The latter property is intended for influencing some envisaged properties of the encoded channel bitstream, e.g. control of the DC-content of the code.

However, the guaranteed parity selection property of the dual code $C_2$ is not satisfactory to guarantee, for instance a DC-control of a predetermined performance level. This is due to the fact that, in the FSM, both channel words of the dual code $C_2$ may lead to different next-states: this would imply that the subsequent encoding paths for the two distinct choices of the channel words of $C_2$ may be completely different, and that the overall parity of the bitstream between the two channel words encoded with the dual code, can be different, so that the DC-control which is driven by the decisions of the words of the dual code $C_2$, gets frustrated, leading to a potentially poor performance with respect to the desired property of the channel bitstream.

It is therefore advantageous to design the states of the FSMs of the channel codes $C_1$ and $C_2$ in order that, upon converting an n-bit information word into the two $m_2$-bit channel words, the two $m_2$-bit channel words not only leave from the same state in the FSM but also end in the same next-state in the FSM. In other words, both channel words of $C_2$, corresponding to the same n-bit information word, have the same next-state. The use of this so-called "same-next-state" property of the dual code $C_2$ leads to the following advantage: the above frustration of the control via $C_2$ is eliminated: the encoding paths of the main code $C_1$ between successive points where $C_2$ is used in the stream of information words is now completely fixed, thus implying the same parity of the channel bitstream encoded with $C_1$ between successive locations where $C_2$ is used, independent of the coding choices of $C_2$.

Having a choice between the two $m_2$-bit channel words, enables performing DC-control in order to achieve a so-called DC-balanced or a DC-free code. E.g. in optical recording, DC-balanced codes are employed to circumvent or reduce interaction between the data written on a record carrier and the servosystems that follow a track on the record carrier. The bytes encoded with the dual code $C_2$ are the points in the channel bitstream that allow for control of the DC-content. Apart from controlling the DC-content of the channel bitstream the bytes encoded with the dual code $C_2$ can be used for influencing other properties of the channel bitstream.

Straightforward DC-control procedures make a decision at each DC-control point depending on an RDS-related criterion, which is evaluated only for the channel bitstream ranging from the considered DC-control point up to the next one. Such locally optimal decision strategy does not exploit all DC-control potential of the channel code. A better approach is to apply look-ahead DC-control, i.e. to build a decision tree of depth N in which the decision at a given DC-control point is determined also by its impact on the subsequent channel bitstream in combination with the future decisions at the next N-1 DC-control points. Each path through the decision tree consists of N branches, and the RDS-criterion applies for the complete path. N-fold Look-Ahead DC-control implies $2^N$ encoding paths, with the drawback of a higher encoder complexity since each byte needs to be encoded $2^N$ times.

For the channel code according to this embodiment, the path followed through the FSM during encoding does not depend on the actual path followed through the N-fold decision tree. This is due to the "same-next-state" property of the two coding options at the dual code $C_2$. Hence, all bytes related to the main code $C_1$, need to be encoded only once, whereas all bytes related to the dual code $C_2$, need to be encoded just twice. This reduces the hardware complexity of the encoding tree down to that related to a simple sequential encoding without further branching. Only the N-fold decision tree of RDS-criteria along the $2^N$ paths remains, resulting in a lower complexity.

An RDS-related criterion can be, for example, the maximum absolute value of the RDS-value itself (first order spectral zero), but also the integrated RDS-value in time (second order spectral zero) or a combination of both can be used. Also the sum variance (SV) can be used as a criterion.

Another method according to the invention is characterized in that the sets of channel words of channel code $C_1$ and the coding states of channel code $C_2$ are arranged that binary channel signal formed by the concatenated $m_1$-bit channel words and the $m_2$-bit channel words comply with a Repeated-Minimum-Runlength-Limitation=6 constraint on the binary channel.

Constraints can also limit the number of consecutive runlengths of the same length. For example, when imposing an RMTR (Repeated Minimum Transition Runlength) constraint of n on a d=2 channel code, this constraint implies that the number of successive 3T runlengths in the sequence of channel words is limited to n. In order to realize a Repeated-Minimum-Runlength-Limitation of 6 constraint, code tables are designed from which possible channel words that could lead to the violation of the RMTR-constraint are eliminated (e.g. the word $(100)^5$). In another way, the RMTR-constraint can also be obeyed by substituting channel words or patterns when an RMTR-violation would take place. More information about this RMTR (Repeated Minimum Transition Runlength) constraint can be found in published patent application WO99/63671-A1 (PHQ 98.023).

Another method according to the invention is characterized in that the ratio between the number of $m_1$-bit channel words and the number of $m_2$-bit channel words is determined in dependence of a chosen measure of DC-control.

It should be noted that the two channel codes $C_1$ and $C_2$ are independent codes each, which can also be used separately. $C_1$ is typically a high-rate code with no systematic structure to steer certain extra properties of the encoded channel bitstream on top of the envisaged runlength constraints (d, k, RMTR). $C_2$ is a slightly lower-rate code and the rate-loss as compared to $C_1$, is used for a systematic structure aimed at steering the additionally required properties. For the invention as described in detail below, $C_1$ and $C_2$ are to be used in combination, from which the term combi-code is derived, but it should be realized that any combination pattern is possible. The more the main code $C_1$ is used (relative to the use of the dual code $C_2$), the higher the rate will be of the overall combination code, but also the lower the controlling capacity will be for the extra envisaged properties of the channel bitstream. With respect to the latter, a maximum of control can be achieved by using the dual code $C_2$ all the time, and a minimum of control is the case when using only the main code $C_1$. It can therefore be understood that the ratio between the number of $m_1$-bit channel words and the number of $m_2$-bit channel words can be determined in dependence upon a chosen measure of DC-control.

Another method according to the invention is characterized in that the coding state is further being established in dependence upon the n-bit information word, thereby allowing to distinguish this n-bit information word by detecting the coding state.

In order to increase the rate of the information signal, it is advantageous that the coding state is also dependent on the n-bit information word to be encoded. As a result, the, same channel word can be used more than one time. In this way, the number of different channel words necessary to construct a channel code is reduced, resulting in a more efficient code. Using states in the framework of a so-called finite-state-machine (FSM) for the characterization of the channel codes $C_1$ and $C_2$, therefore provides a possibility of establishing an overall code with a high rate due to the multiple use of the same channel word with different next-states. At the decoder, it is the channel word in combination with the next-state, that uniquely determines the corresponding information word.

Another method according to the invention is characterized in that the coding states of channel code $C_1$, and the coding states of channel code $C_2$ are further arranged that a limited number of channel words is substituted for other channel words or patterns, these other channel words or patterns not belonging to the sets of channel words of channel code $C_1$ and channel code $C_2$.

In a practical design of a channel code based on the combination of two codes $C_1$ and $C_2$ according to the invention, there is some extra room for the design of limited, stochastic control on top of the guaranteed control. Stochastic control is understood to be the kind of control in which the actual use of this control depends on the actual data content (information words) that enters the encoder.

The existence of the room for stochastic DC-control is due to the fact that—in a practical code—some specific patterns do not occur in the channel bitstream under normal application of the channel code; these patterns can then be used as substitution patterns for other patterns that are allowed in the channel bitstream.

By substituting a limited number of channel words or patterns for other channel words or patterns not belonging to the channel words or patterns present in the binary channel signal before the substitutions, additional DC-control can be accomplished, for instance, if the substitutions imply a parity inversion.

The coding methods as described in the above embodiments have the following advantages, which are obvious or will be clarified in the Figure description, i) guaranteed DC-control, ii) reduced error-propagation because of the byte-oriented nature of the encoding, iii) simple single-pass encoding scheme, resulting in reduced encoder complexity for performing encoding with look-ahead DC-control.

The invention also relates to a device for encoding. The invention also relates to a signal comprising a stream of databits of a constrained binary channel signal. The invention further relates to a record carrier and to a device for decoding.

BRIEF DESCRIPTION OF THE DRAWINGS

These and other aspects of the invention will be further described in the Figure description, in which FIG. 2 shows an example of a 6-state Finite-State-Machine to be used for the main code (channel code $C_1$), aimed for the channel constraints d=2, k=10, FIG. 3 shows an example of a 6-state Finite-State-Machine to be used for the dual code (channel code $C_2$), aimed for the channel constraints d=2, k=10, FIG. 4 shows the code tables of the main code $C_1$, FIG. 6 shows an example of how decoding of the next-state function of the channel words of the main code is performed, FIG. 7 shows an example of how decoding of the next-state function of the channel words of the dual code is performed, FIG. 20 shows a 5-state Finite-State Machine, half-bit description for d=1, FIG. 21 shows a 7-state Finite-State Machine, half-bit description for d=1.

DETAILED DESCRIPTION OF THE INVENTION

Figure 1:
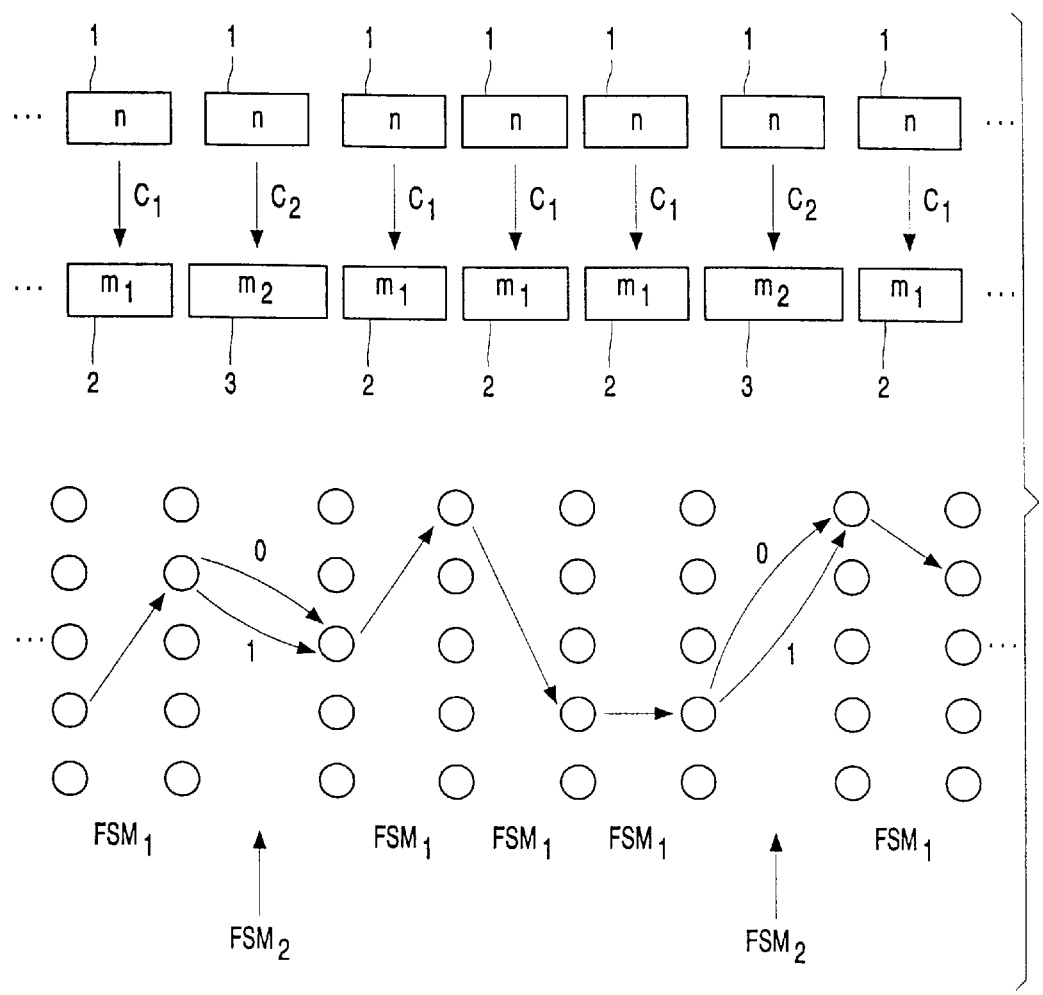
FIG. 1 shows an example of the coding method.

FIG. 1 shows graphically an example of the coding method. Using this method predetermined properties of the binary channel signal can be influenced, for example for guaranteed DC-control via the alternation of two codes $C_1$ and $C_2$ via an alternation pattern that is also known at the decoder.

We consider two channel codes, $C_1$ and $C_2$. Both codes are applied on n-bit symbols. Channel code $C_1$ is a high-rate code with n-to-$m_1$ mapping, channel code $C_2$ is a low-rate code with n-to-$m_2$ mapping. In this example, for d=2, k=10, $C_1$ has a 8-to-15 mapping, and $C_2$ has a 8-to-17 mapping (n=8, $m_1$=15, $m_2$=17). Guaranteed DC-control, i.e. DC-control for every possible sequence of information words is achieved if the following conditions are satisfied: for each n-bit symbol, channel code $C_2$ has two channel words, one with even and one with odd parity in order to influence the RDS-value of the binary channel signal; for each n-bit symbol, the two possible channel representations of code $C_2$ have the same next-state. The Finite-State-Machines (FSMs) of codes $C_1$ and $C_2$, indicating the states and state characterisations of the channel codes $C_1$ and $C_2$, have the same number of states, and the FSM are based on the same approximate eigenvector (according to Franazek's definition, see §5.3.1. of the book "Codes for mass data storage systems", K. A. Schouhamer Immink, November 1999, Shannon Foundation Publishers (ISBN-90-74249-23-X), which implies that channel words ending with a given number of zeroes have a certain multiplicity, irrespective of the fact whether they are part of a channel word from the main code $C_1$ or from the dual code $C_2$. The approximate eigenvector in this case of d=2, k=10 which satisfies an approximate eigenvector inequality is the following: $V_{(d=2, k=10)}$={2,3,4,4,4,4,3,3,3,2,1}.

However, the characterization of the states of $FSM_1$ for $C_1$ and $FSM_2$ for $C_2$ may be different. These state characterizations are chosen in order to realize the constraints imposed on the binary channel signal. These constraints can be, for example, run length limiting constraints (d,k) or an RMTR constraint. In this way, the constraints imposed on the binary channel signal, formed by concatenating the $m_1$-bit channel words and the $m_2$-bit channel words, are satisfied. We can call channel code $C_1$ the main code, whereas channel code $C_2$ is referred to as the dual code. The upper part of FIG. 1 depicts an n-bit information word 1 which is converted into an $m_1$-bit channel word 2 via a channel $C_1$ or into an $m_2$-bit channel word 3 via a channel code $C_2$.

The two available $m_2$-bit channel words are indicated in FIG. 1 by the corresponding parities, "0" and "1". The arrows in the lower part of this Figure depict the "flow" through the coding states of the Finite-State-Machines $FSM_1$ and $FSM_2$ when converting the information words. It can be seen that when converting an information word into an $m_1$-bit channel word, only one arrow points from the coding state of the channel word to the coding state of the next channel word, whereas when converting an information word into an $m_2$-bit channel word, two arrows point from the coding state of the channel word to the coding state of the next channel word, indicating the choice between the two available $m_2$-bit channel words.

The lower part of FIG. 1 depicts that for each information word (256 entries as the information words are 8 bits long, n=8) two $m_2$-bit channel words are available with opposite parities and with the same next-state. When converting an n-bit information word into an $m_2$-bit channel word, this $m_2$-bit channel word can be chosen from the two available $m_2$-bit channel words. In this example, this choice in used to create a DC-balanced or DC-free channel code.

FIG. 2 shows an example of the state characterization for a 6-state Finite-State-Machine to be used for the main code (channel code $C_1$). In this example the channel constraints to be complied with are d=2 and k=10 and the channel code $C_1$ has a 8-15 mapping. FIG. 3 shows an example of a 6-state Finite-State-Machine to be used for the dual code (channel code $C_2$). In this example the channel constraints to be complied with are d=2 and k=10 and the channel code $C_2$ has a 8-17 mapping.

In these Figures, a notation of "$-10^2$|", as can be found in the column words IN in state 1 of the main code, indicates all channel words with an ending "100". In the same way "$|010^{10}1-$", as can be found in the column words OUT of state 2 of the main code, indicates all channel words with a beginning "0100000000001".

The Finite-State-Machines (FSMs) of codes $C_1$ and $C_2$ have the same number of states, and the FSMs are based on the same approximate eigenvector, which implies that channel words ending with a given number of zeroes have a certain multiplicity, irrespective of the fact whether they are part of a channel word from the main code $C_1$ or from the dual code $C_2$. In the FSM of the dual code $C_2$, each branch leaving a state corresponds to two possible channel words (word-pair) with i) opposite parity and ii) the same next-state. The FIGS. 2 and 3 show that the multiplicity of any channel word in the 6-state FSMs ranges between 1 and 4.

A lot of channel words or word-pairs are used more than once across different states. By appropriate mating, i.e. grouping of the same combination of channel words or word-pairs together with next-states to one single table entry for more than one state, error propagation can be reduced because a precise distinction of the states leading to the given channel word has become irrelevant for these channel words or word pairs. In fact, the codes $C_1$ and $C_2$ allow full state-independent decoding.

The skilled person is familiar with channel codes comprising different states, the states forming a Finite-State-Machine. Detailed information on state-coding can be found in literature, for example in European Patent Specification EP 0 745 254 B1 (PHN 14.746) or in the book "Codes for mass data storage systems", K. A. Schouhamer Immink, November 1999, Shannon Foundation Publishers (ISBN-90-74249-23-X).

In §5.3 of this book it is explained that, in order to be able to construct a sequence of channel words complying with the constraints imposed on a channel code, at east M words that terminate at the same or other principal states must emanate from each coding state. The existence of a set of coding states is therefore a necessary condition for the existence of a code for the specified number of information words (256 in case of an 8-bit information word). It can be shown that if an approximate eigenvector satisfies an approximate eigenvector inequality, then a fixed-length code with the predetermined constraints and other parameters of the code can be ascertained. More details can be found in §5.3.1 of this book and in the literature references therein.

The invention in the above embodiment is not limited to a method of encoding in order to realize a binary channel signal with guaranteed DC-control and reduced error propagation, with the parameters d=2, k=10, n=8, m=15, $m_2$=17; a skilled person can apply the teaching of the method of encoding according to the invention, without departing from the scope of the invention, to generate a binary channel signal with, for example, d=2, n=7 or d=2 or n=13. He can, for example, also generate a binary channel signal with a d=1 constraint.

For d=2 channel coding, the dual code $C_2$ of the combi-code needs two channel bits extra for each channel word, in comparison with the channel words of the main code (8-to-17 and 8-to-15 mappings of main and dual code, respectively). As a rule of thumb, the extra overhead in terms of channel bits, needed for the design of the dual code is the inverse value of the rate R of the channel code. For d=2, k=10 the maxentropic capacity (theoretical upper limit for the rate) equals 0.5418, thus around 1.846 "bits" are needed, which is rounded towards 2.

For d=1 channel coding, the situation is quite different. The maxentropic capacity (without k-constraint) equals 0.6942, so that usually codes are designed with a rate, equal to ⅔. Byte-oriented codes with an 8-to-12 mapping can then be used for the main code. The extra number of "bits" needed for the channel words of the dual code now amounts to 1.441 "bits". Rounding towards 2 would lead to a dual code with an 8-to-14 mapping, but then a rate-loss of more than a half bit results, which makes the combi-code approach as such less interesting from the point of view of capacity. An extra measure, which will be discussed in the following, is needed in order to avoid the above rate-loss.

Figure 16:
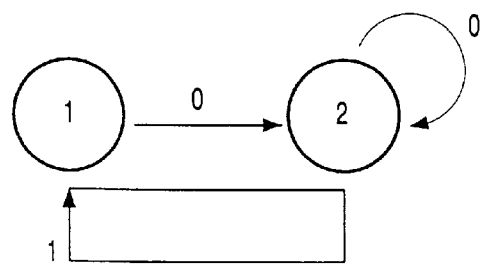
FIG. 16 shows a Finite-State Machine, full-bit description for d=1.
Figure 17:
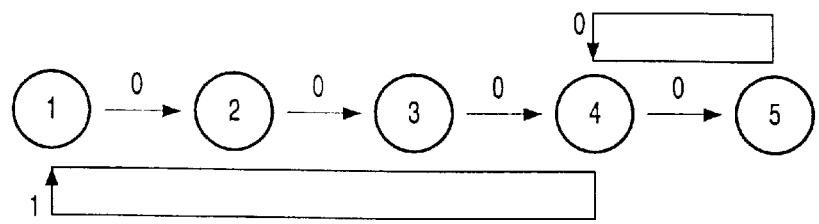
FIG. 17 shows a Finite-State Machine, half-bit description for d=1.

The present solution is worked out for the case d=1: for other d-constraints, similar solutions can be devised. The solution for d=1 is to describe the channel coding in terms of half-bits, instead of the common description in terms of full bits. The standard full-bit FSM for d=1, and the half-bit FSM are shown in FIGS. 16 and 17, respectively.

Figure 18:
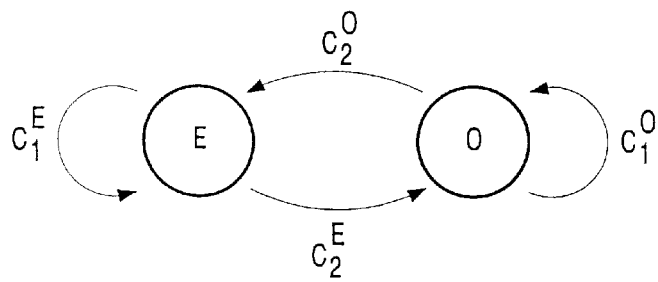
FIG. 18 shows a 2-state Finite-State Machine for d=1.

In the half-bit FSM, one can make a distinction between Even States, where words entering these states have an even number of trailing zeroes, and Odd States, where words entering these states have an odd number of trailing zeroes. The Even States are numbered {1,3,5}, the Odd States are numbered {2,4}. In the half-bit FSM, we consider an 8-to-24 mapping for the main code, and an 8-to-27 mapping for the dual code. There exist now two versions of the main code: one with E-to-E coding, going from one of the states {1,3,5} towards one of the states {1,3,5}, the other with 0-to-0 coding, going from one of the states {2,4} towards one of the states {2,4}. There also exist two versions of the dual code: one with E-to-O coding, going from one of the states {1,3,5} towards one of the states {2,4}, the other with O-to-E coding, going from one of the states {2,4} towards one of the states {1,3,5}. It is convenient to consider a two-state FSM for the encoding with the combi-code, consisting of the E and the O state, as shown in FIG. 18. Encoding with the main code does not lead to a state change (E→E or O→O), whereas encoding with the dual code always leads to a state change (E→E or O→O) because the number of half-bits in a channel word of the dual code is odd.

Figure 19:
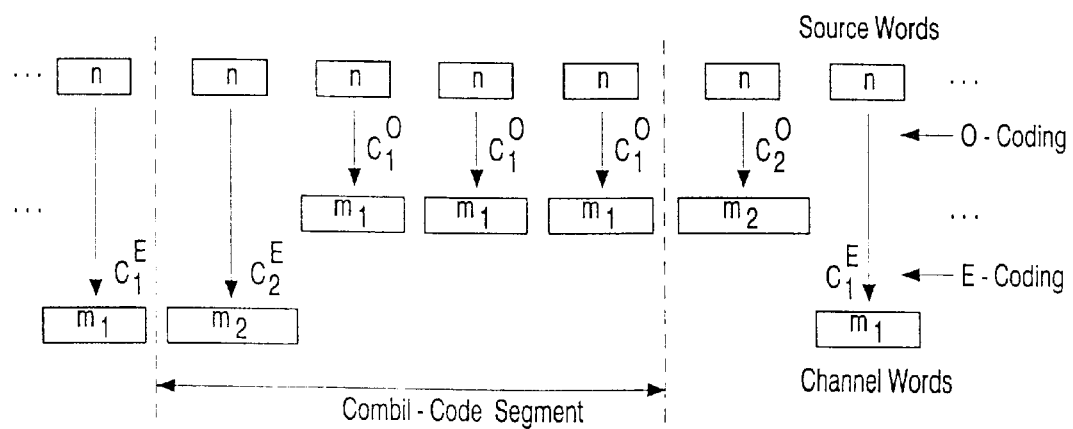
FIG. 19 shows a code alternation of channel code $C_1$ and channel code $C_2$ for d=1.

The encoding sequence for successive segments of the combi-code is shown in FIG. 19. A segment is a sequence of source words (bytes), the first of which is to be encoded with the dual code $C_2$, and all subsequent source words (bytes) are to be encoded with the main code $C_1$.

For the generation of channel words for the two main codes, we adopt the following argumentation. A full-bit channel word (of length 12 bits) can be converted into a half-bit channel word (of length 24 half-bits) for the E-state via the conversion rules 0→00 and 1→01, implying that a full-bit channel word $|0^n 1 \rightarrow 10^m|$ is converted into $|0^{2n+1} 1 \rightarrow 10^{2m}|$. The arrow from "1" to "1" indicates any valid sequence according to the respective FSMs. Note that due to the conversion, there can only be an odd number of zeroes in between two ones of the half-bit word, in agreement with the half-bit FSM.

A full-bit channel word can be converted into a half-bit channel word for the O-state via the conversion rules 0→00 and 1→10, implying that a full-bit channel word $|0^n 1 \rightarrow 10^m|$ is converted into $|0^{2n} 1 \rightarrow 10^{2m+1}|$.

The generation of words for the dual codes is slightly more involved. For the E-state, we convert a 13-bit channel word on, $|0^n 1 \rightarrow 10^m|$ first into a half-bit channel word of length 26, and supply an extra bit x at the end: $|0^{2n+1} 1 \rightarrow 10^{2m}|$. It is obvious that for the E-state, only x=0 is allowed. The concatenation with the extra bit x=0 implies the construction of a half-bit channel word of length 27, with the next-states being converted from {1} to {2}, and from {3,5} to {4}. For the O-state, a similar procedure leads to the 27-half-bit channel word $|0^{2n} 1 \rightarrow 10^{2m+1}|x$, where x=1 is allowed only if m≦1, then leading to state 1 as next-state. The other possibility x=0 is always allowed, leading to state 3 as next-state if m is even, and to state 5 as next-state if m is odd.

The possibility of constructing such a code is easily enumerated. We consider the approximate eigenvector {2,2,3,4,3} for the states of the half-bit FSM. Further, we restrict n≦5 and m≦5 (in view of a k-constraint, which is not imposed via the FSM). It is not our present aim to construct a most optimal code (in terms of the k-constraint, given d=1), but we merely want to show the feasibility of the proposed measures for the design of combicodes for d=1.

For the main code, in state E with states {1,3,5}, i.e. code $C_1^E$, we have for words leaving from state 1 that n≧1, and 519 words are available, which is enough since the state multiplicity of state 1 equals 2, thus 512 words are needed; for words leaving from states 3 and 5, we have that n≧0, and 872 words are available, which is enough since the state multiplicity of states 3 and 5 equals 3, thus 768 words are needed.

For the main code, in state O with states {2,4}, i.e. code $C_1^O$, we have for words leaving from state 2 that n>1, and 638 words are available, which is enough since the state multiplicity of state 2 equals 2, thus 512 words are needed; for state 4, we have that n≧0, and 1072 words are available, which is enough since the state multiplicity of state 4 equals 4, thus 1024 words are needed.

For the dual code, we have to account for the "same next-state" property according to the present invention. For the dual code, in state E with states {1,3,5}, i.e. code $C_2^E$, we have for words leaving from state 1 that n≧1, and there are 132 even-parity and 130 odd-parity channel words with state 2 as the next-state, and there are 384 even-parity and 388 odd-parity channel words with state 4 as the next-state, yielding a total of 514 possible entries for the dual code, which is enough since the state multiplicity of state 1 equals 2, requiring 512 entries; for words leaving from states 3 and 5, we have that n≧0, and there are 220 even-parity and 220 odd-parity channel words with state 2 as the next-state, and there are 648 even-parity and 648 odd-parity channel words with state 4 as the next-state, yielding a total of 868 possible entries for the dual code, which is enough since the state multiplicity of states 3 and 5 equals 3, requiring 768 entries.

For the dual code, in state O with states {2,4}, i.e. code $C_2^O$, we have for words leaving from state 2 that n≧1, and there are 194 even-parity an d 192 odd-parity channel words with state 1 as the next-state, and there are 300 even-parity and 300 odd-parity channel words with state3 as the next-state, and there are 186 even-parity and 186 odd-parity channel words with state 5 as the next-state, yielding a total of 678 possible entries for the dual code, which is enough since the state multiplicity of state 2 equals 2, requiring 512 entries; for words leaving from state 4, we have that n≧0, and there are 324 even-parity and 324 odd-parity channel words with state 1 as the next-state, and there are 504 even-parity and 504 odd-parity channel words with state3 as the next-state, and there are 312 even-parity and 312 odd-parity channel words with state 5 as the next-state, yielding a total of 1140 possible entries for the dual code, which is enough since the state multiplicity of state 4 equals 4, requiring 1024 entries.

In the case of d=1, k=7, the following eigenvector satisfies an approximate eigenvector inequality: $V_{(d=1,k=7,s=2)}$={3,4, 5,6,5,6,4,6,3,3,3,3,3,2,2}. The accompanying Finite-State Machines, a 5-state and a 7-state Finite-State Machine, half-bit description for d=1, are shown in FIG. 20 and FIG. 21. In the columns Fan-Out Main Code and Fan-Out Dual Code of these Figures the number channel words is indicated. It can be seen that the number of redundant words can be different for the main code or the dual code.

Figures 4, 4A, 4B, 4C, 4D, 4E, 4F, 4G, 4H, 4I:
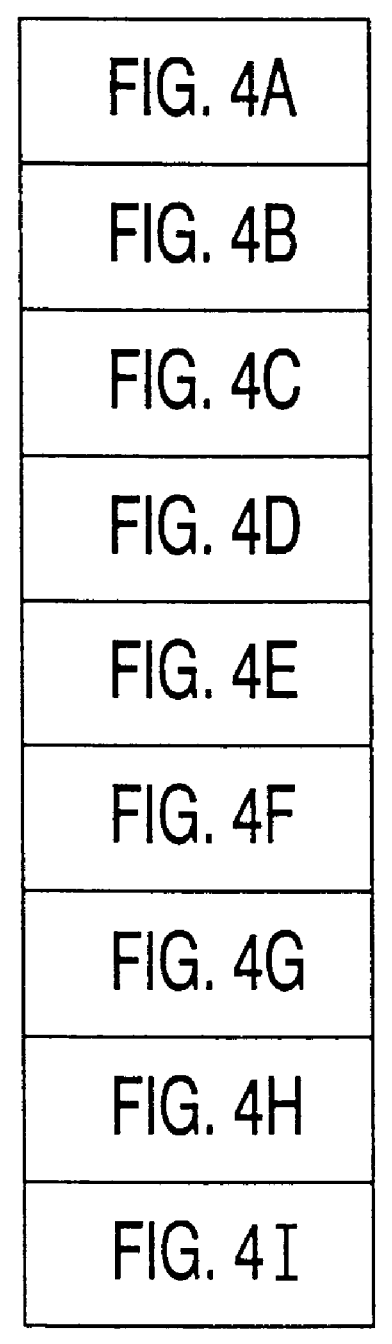
Figure 4A:
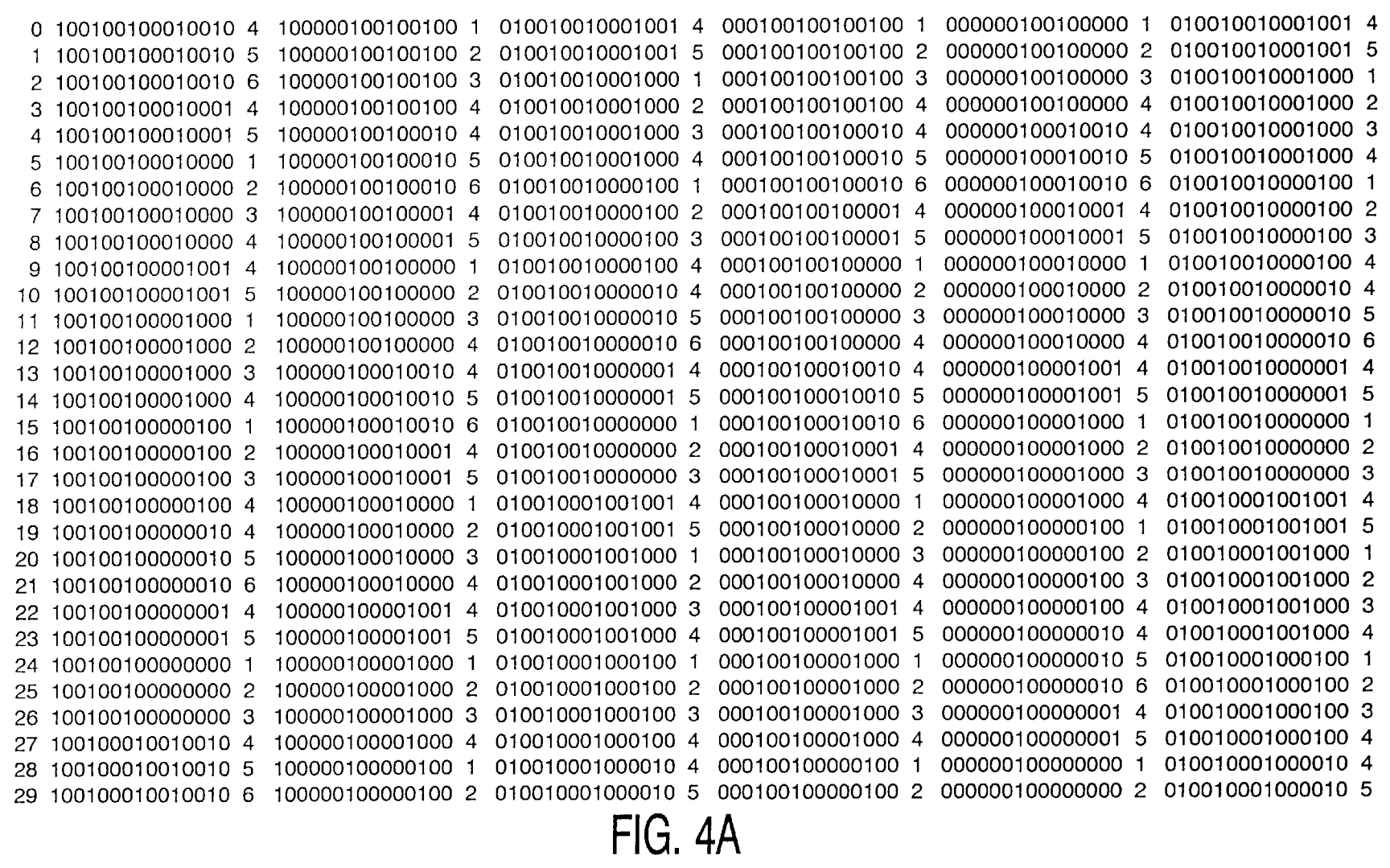
Figure 4G:
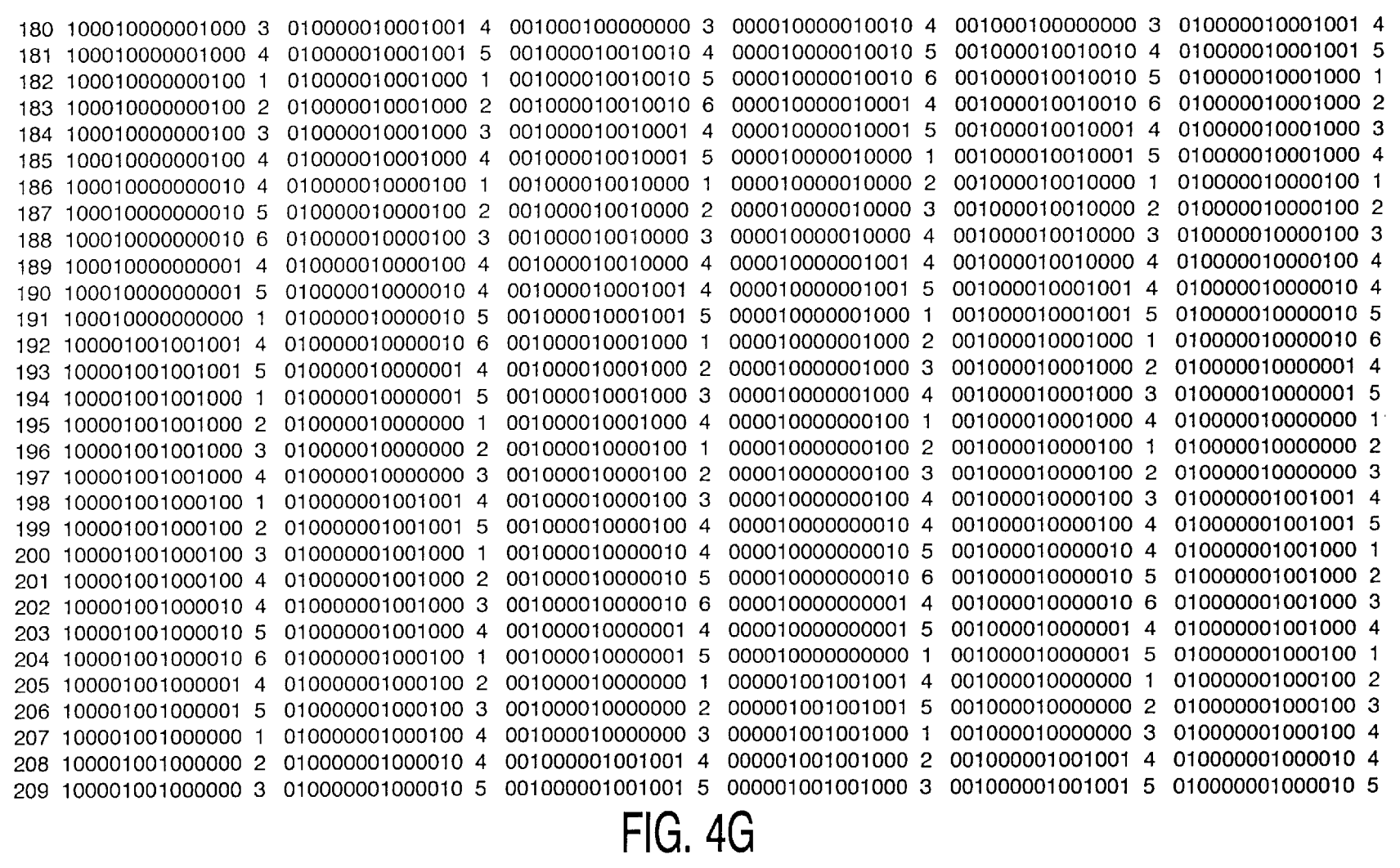
Figure 4I:
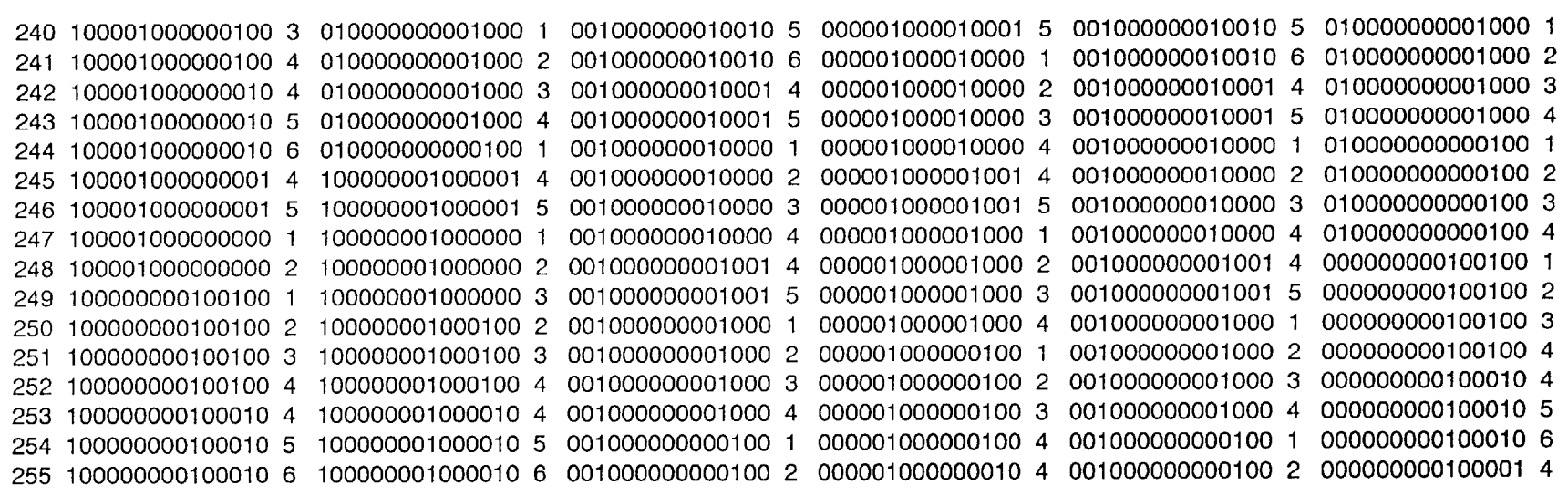

FIG. 4 shows the code tables of the main code (channel code $C_1$), d=2, k=10, RMTR=6, with the entry index representing the index of the 8-bit information symbol (0255). For each entry, one 15-bit long channel word is listed together with the corresponding next-state.

Figure 5:
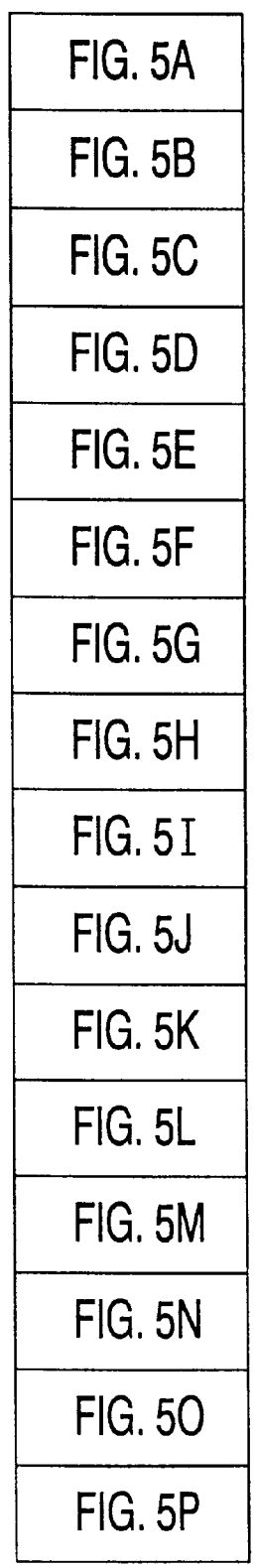
FIG. 5 shows the code tables of the dual code $C_2$.
Figure 5A:
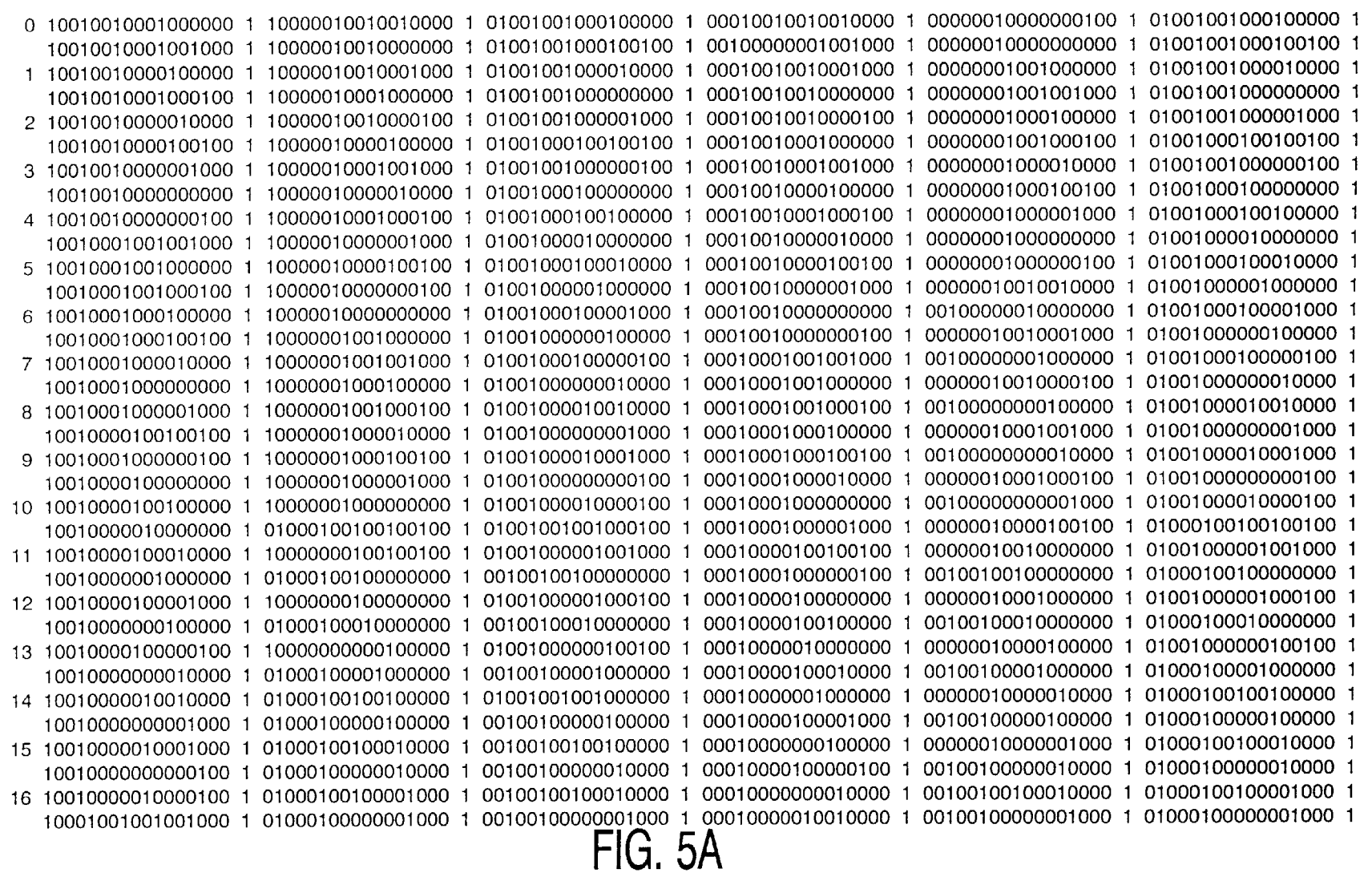
Figure 5C:
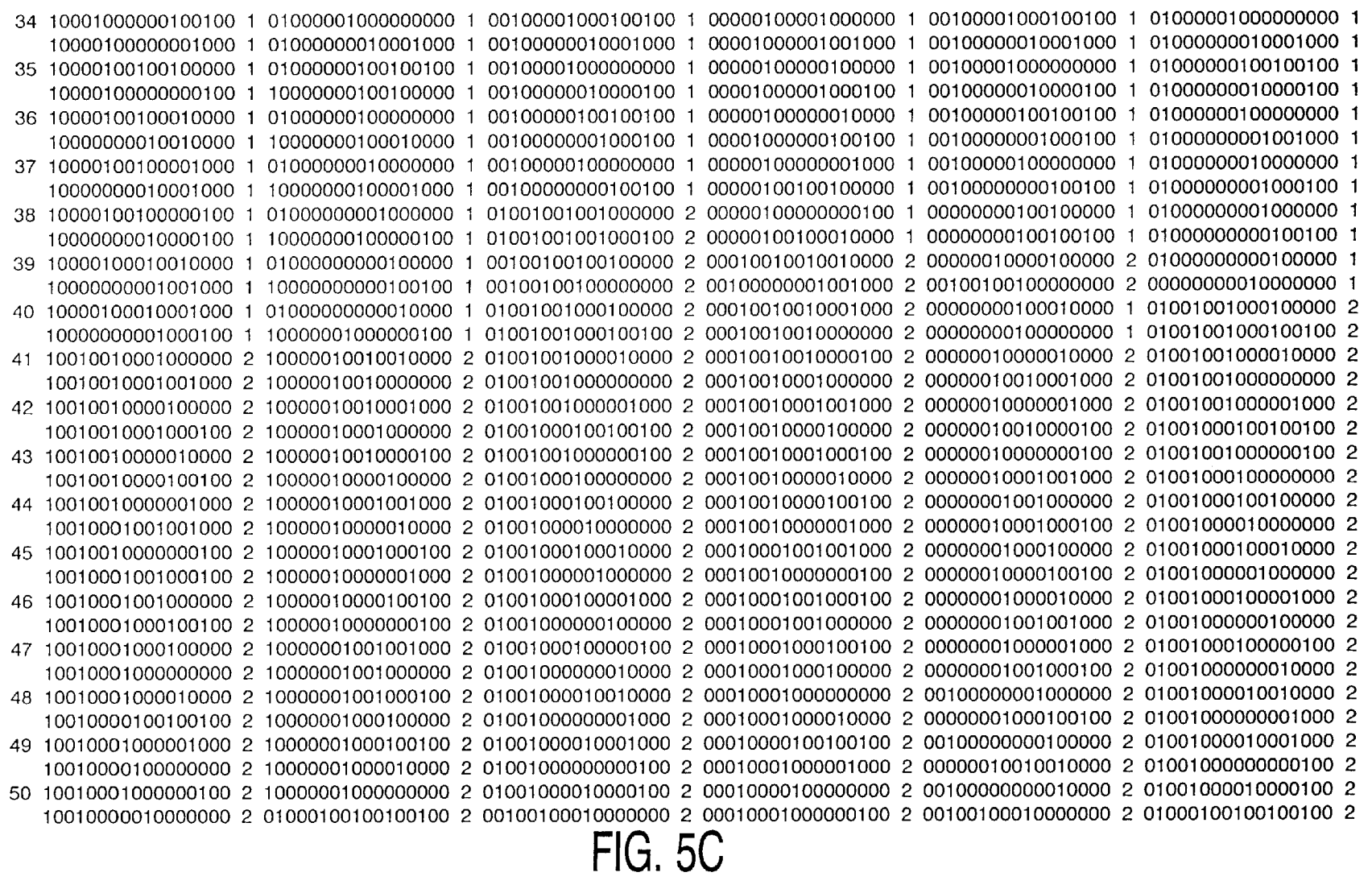
Figure 5D:
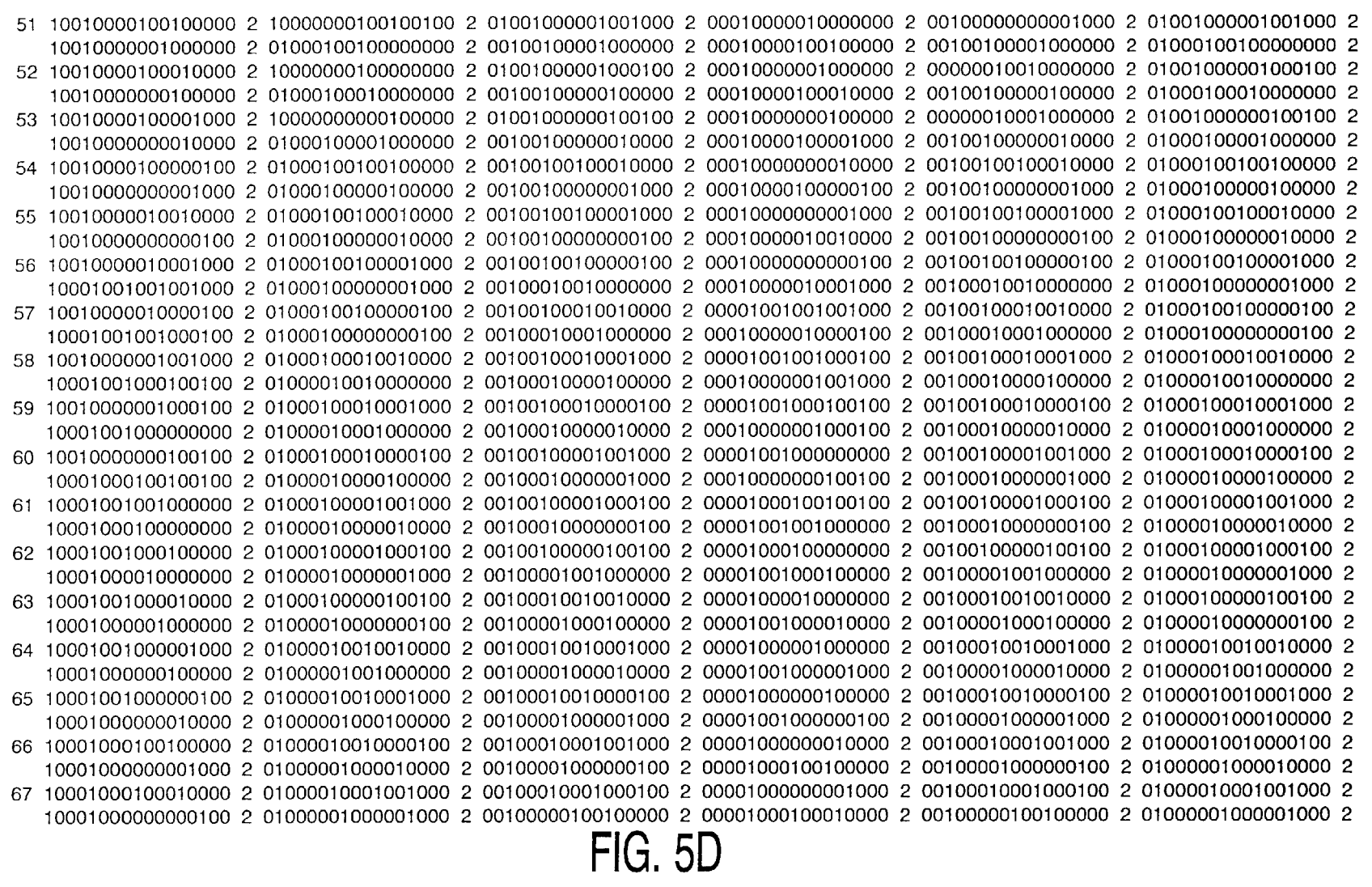
Figure 5E:
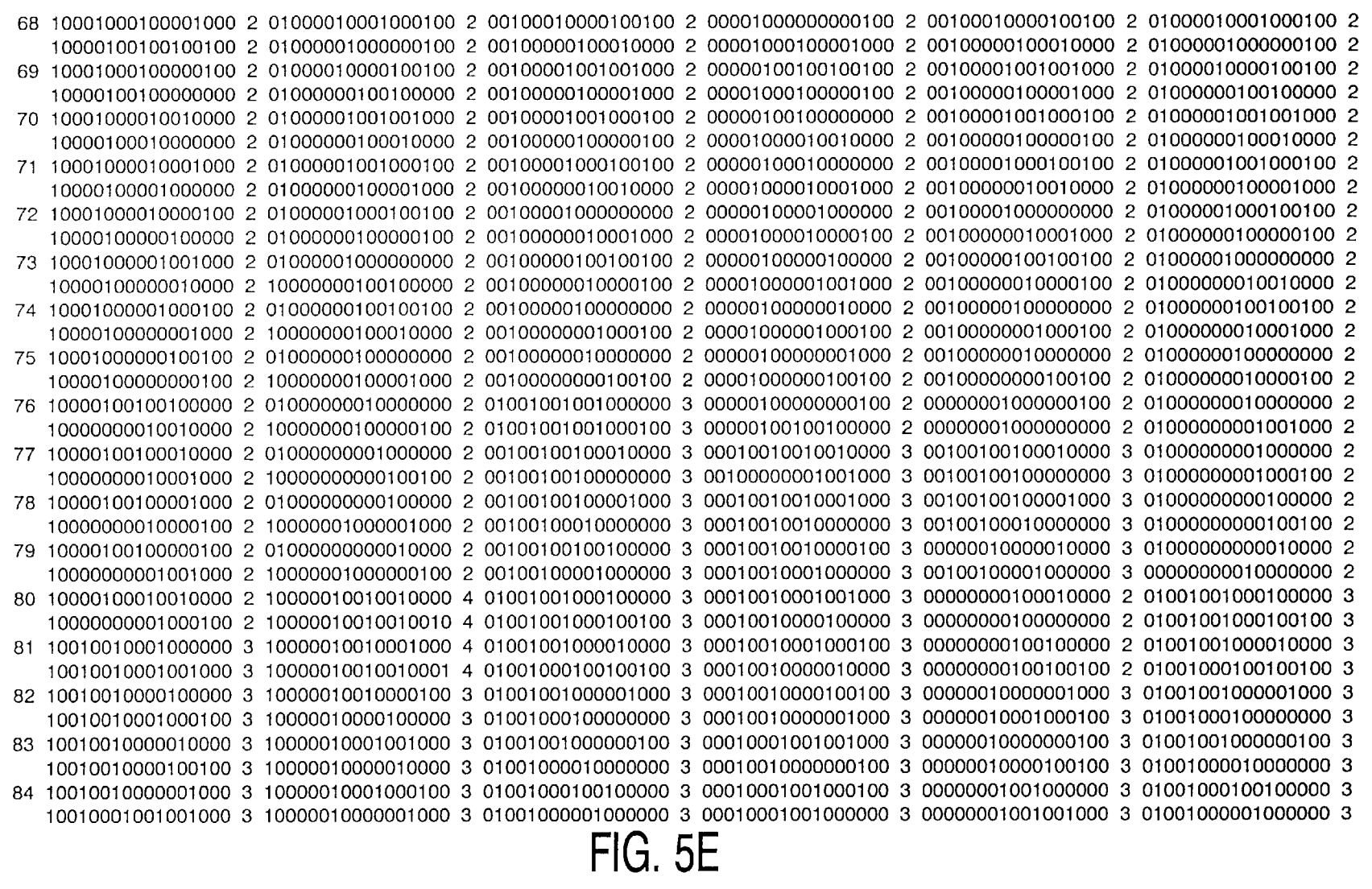
Figure 5G:
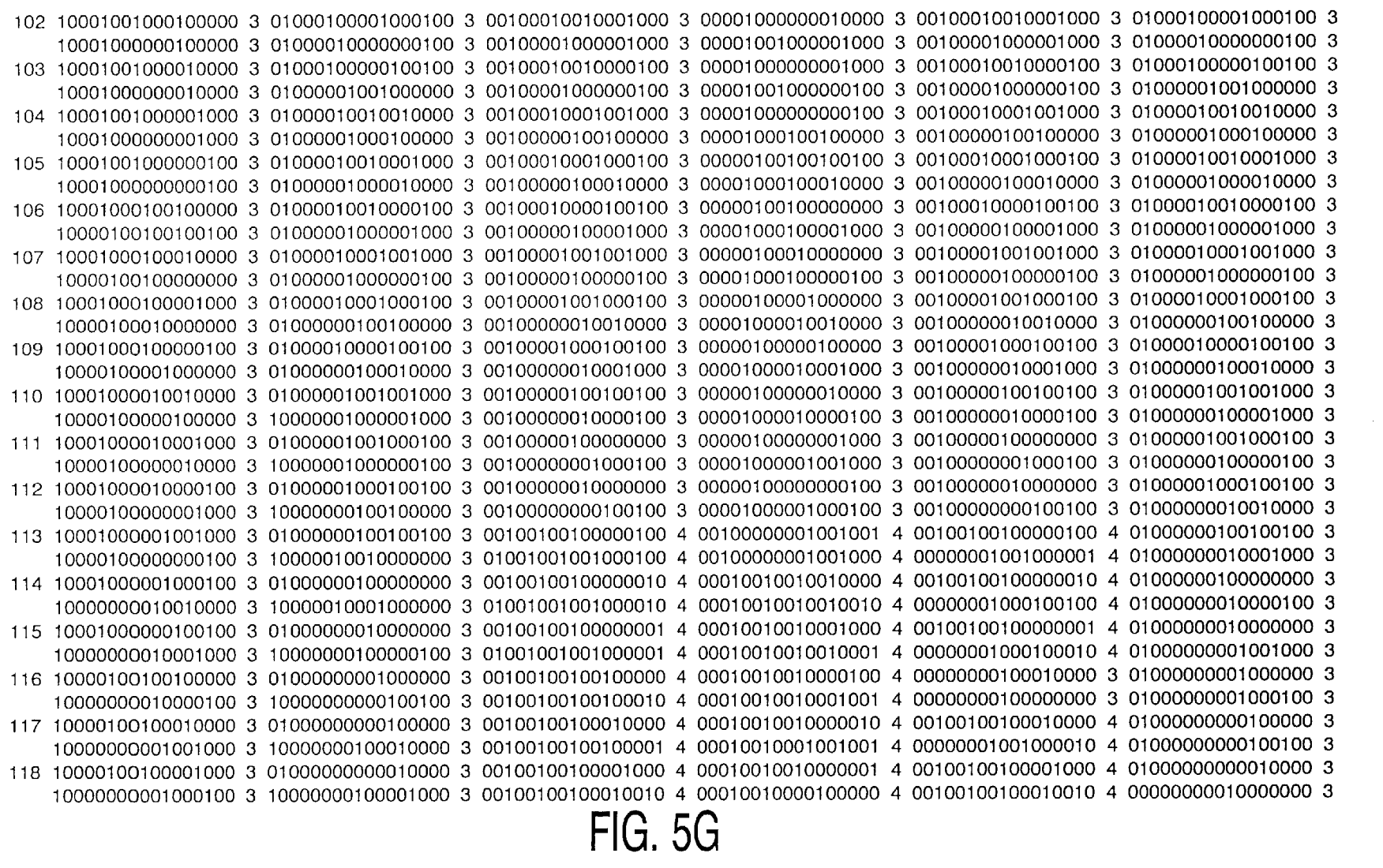
Figure 5I:
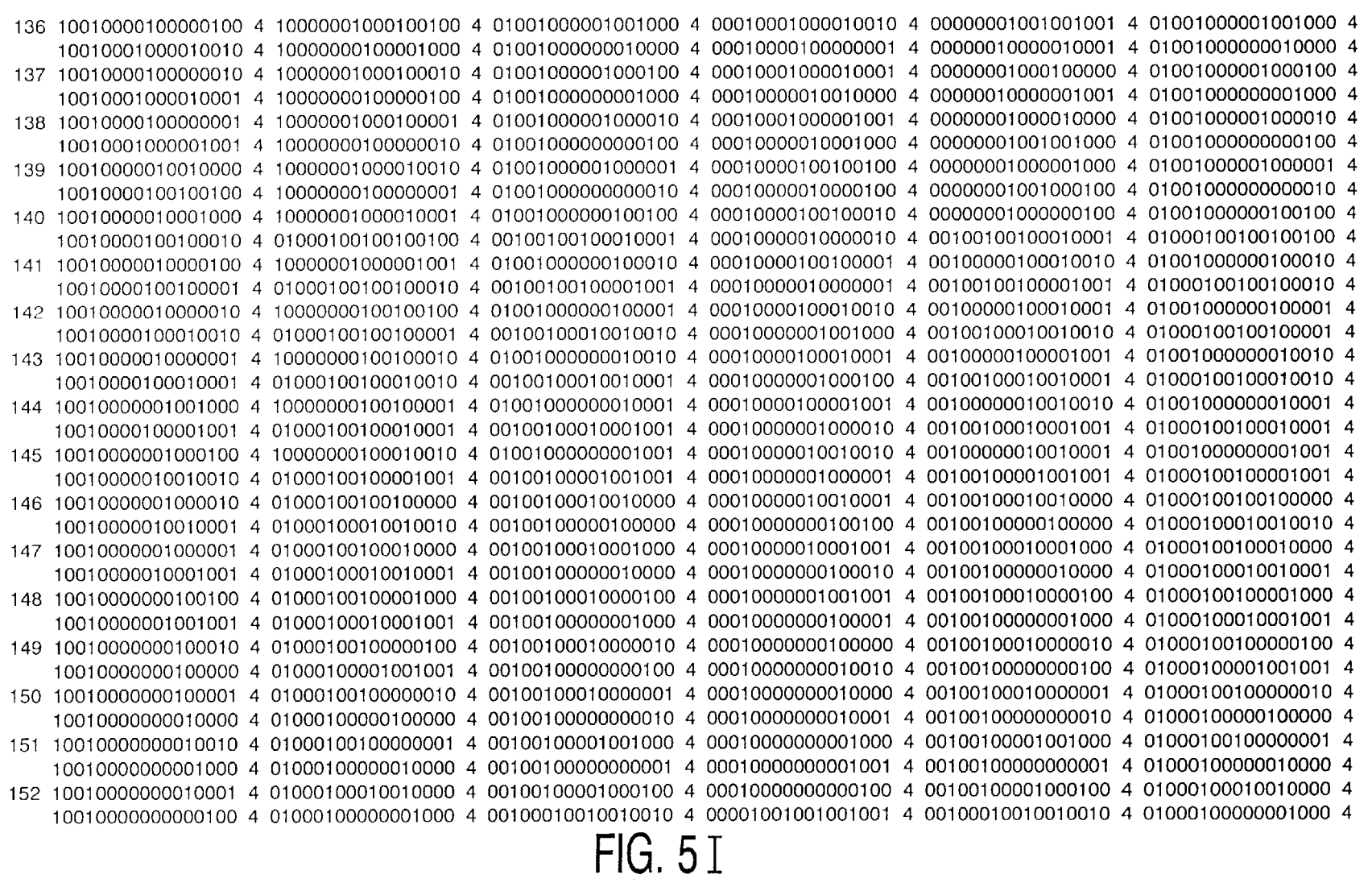
Figure 5J:
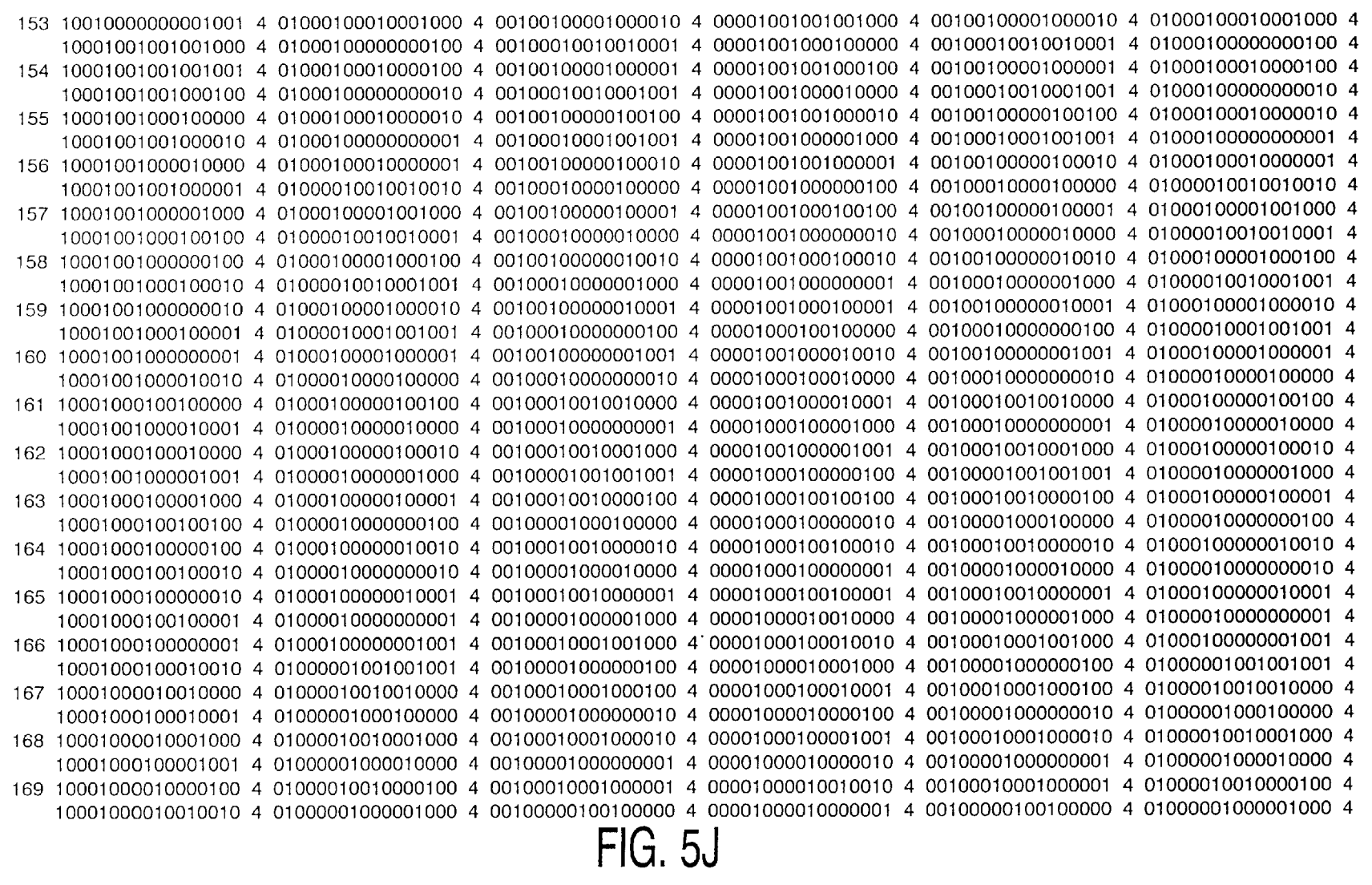
Figure 5K:
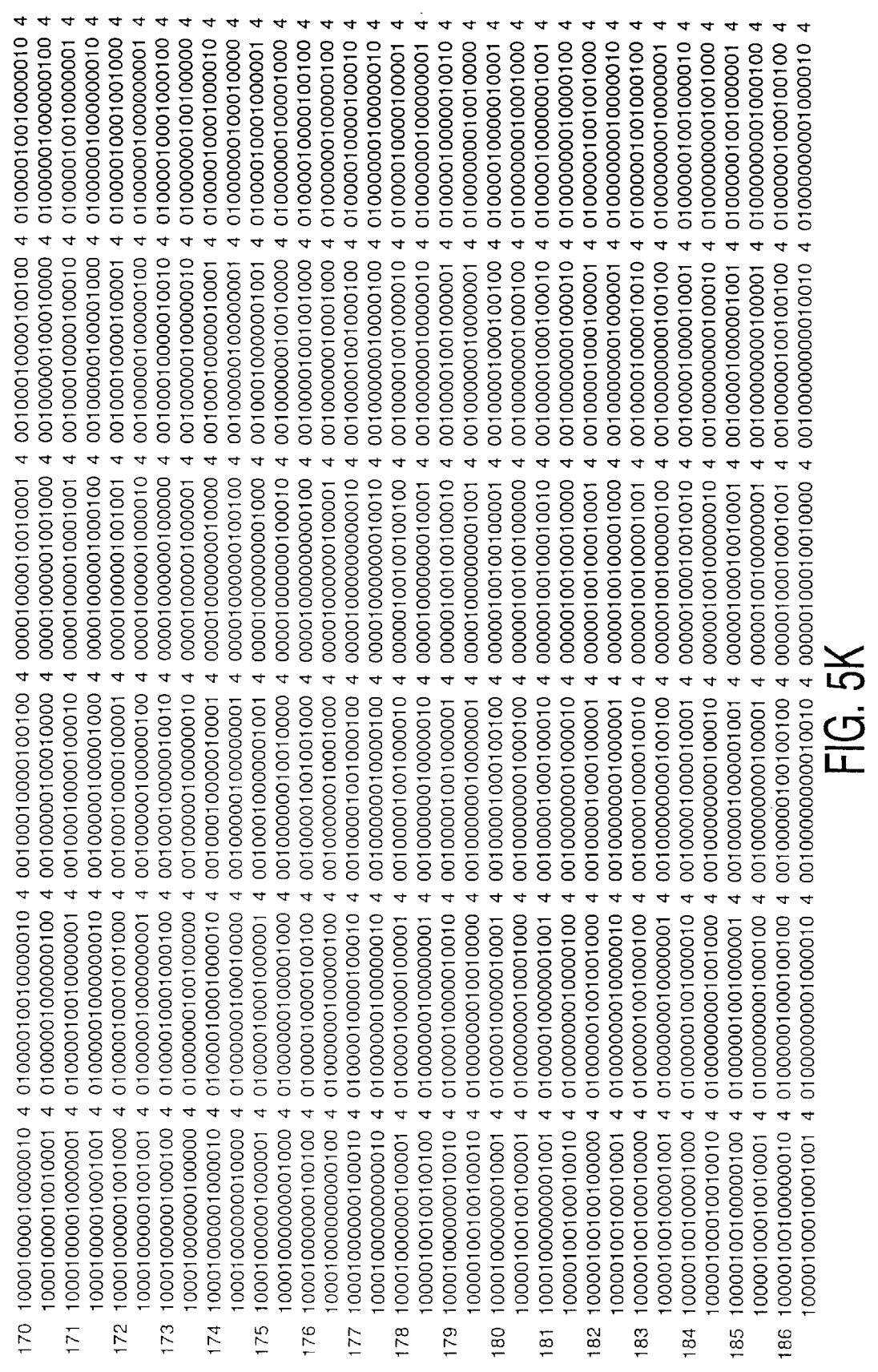
Figure 5L:
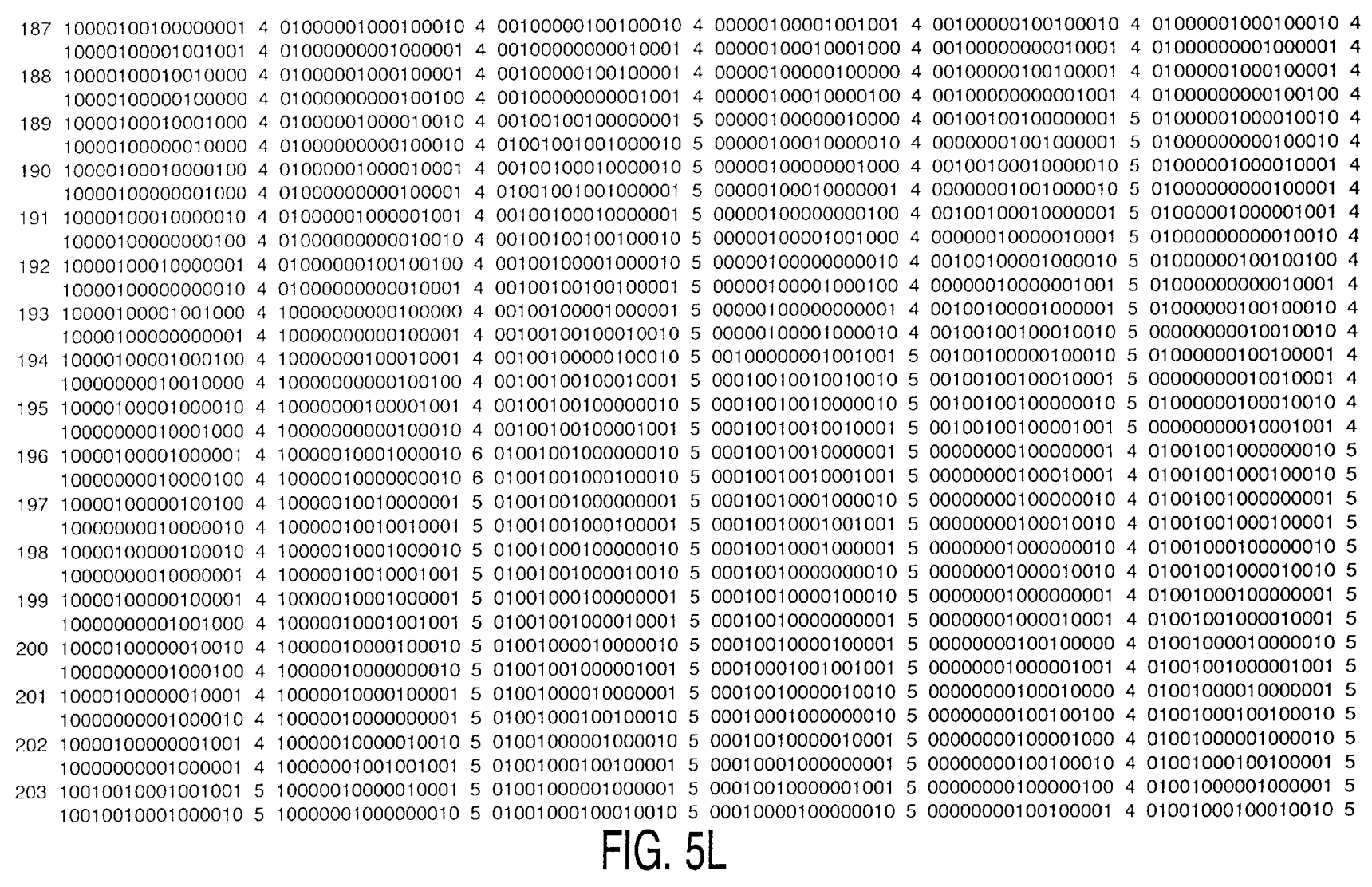
Figure 5N:
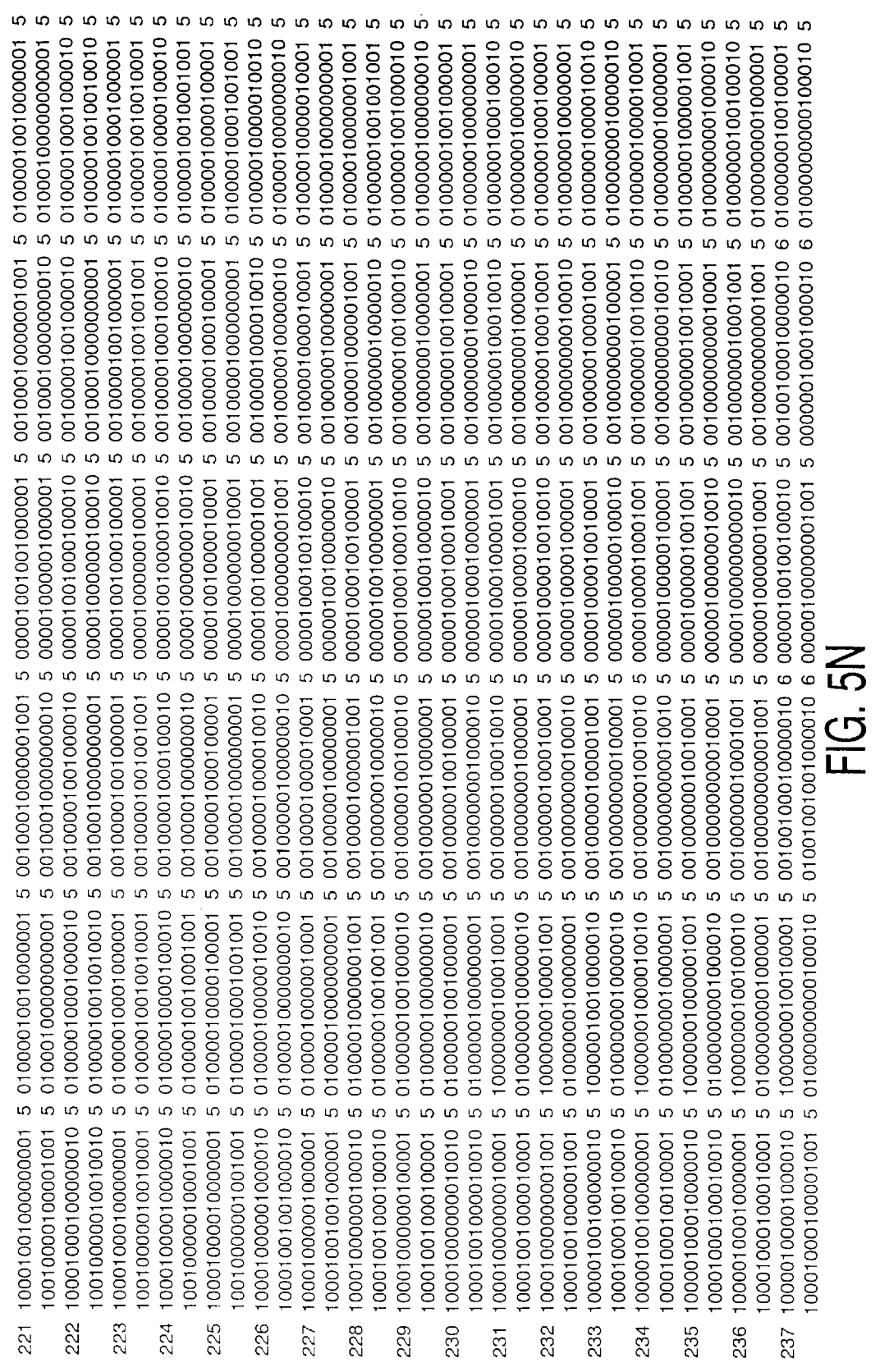
Figure 5P:
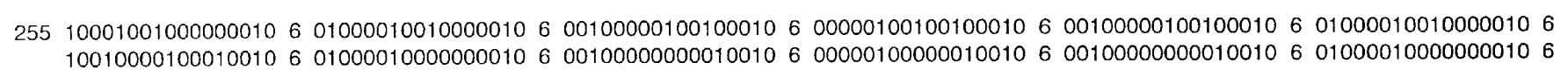

FIG. 5 shows the code tables of the dual code $C_2$ (channel code $C_1$), d=2, k=10, RMTR=6, with the entry index representing the index of the 8-bit information symbol (0–255). For each entry, the two 17-bit long channel words (wordpairs) are listed together with the corresponding next-states. These next-states are identical.

The systematic structure of the main code $C_1$ and the dual code $C_2$ realized a guaranteed control of the extra desired properties of the channel bitstream (like a DC-free property). In an embodiment of a channel code based on the combination of two codes $C_1$ and $C_2$, there is some extra room for the design of (limited) stochastic control on top of the guaranteed control. Stochastic control is understood to be of control in which the actual use of this control depends on the actual data content that enters the encoder.

The existence of the room for stochastic DC-control is due to the fact that—in a practical code—some specific patterns do not occur in the channel bitstream under normal application of the channel code; these patterns can then be used as substitution patterns for other patterns that are allowed in the channel bitstream. For instance, if the substitutions imply a parity inversion, then the substitutions can be used for additional DC-control, in the same sense as the substitution table is used in the EFM-Plus code. The evaluation which pattern is to be selected can be performed on the basis of an RDS-related criterion, e.g. with one byte look-ahead. Although the invention as described so far is related to a channel code with a guaranteed control in the combination of two codes, the invention also relates to using this stochastic control in a limited number of substitutions.

We will outline below some of the possibilities (referred to as A to O) of stochastic control for the main code $C_1$ and dual code $C_2$ according to the code tables of FIGS. 4 and 5. We limit ourselves here to those which are the easiest to be implemented. For both the main and dual code we have the possible substitutions (where bits between brackets, like (zu) refer to 17-bit channel words of channel code $C_2$):

A.
|100 100 000 100 0 xy (zu)→1 100 100 00 100 0 xy (zu)
, if the RMTR=6 constant is not violated.

B.
|010 010 000 01 00x (yz)→|10 010 010 010 00x (yz)
, if the RMTR=6 constraint is not violated, and when the current state is not state3.

C.
|001 001000 001 000 (xy)→|001 001 001 001 000 (xy)
, if the RMTR=6 constraint is not violated and when the current state is not state3.

D.
If a channel word has as an ending: $-10^2$, the following substitutions can be applied on the next channel word:
$10^51-\rightarrow0^61-$
$10^61-\rightarrow0^71-$
$10^71-\rightarrow0^81-$ E.
If a channel word has as an ending: $-10^3$, the following substitutions can be applied on the next channel word:
$10^51-\rightarrow0^61-$
$10^61-\rightarrow0^71-$ F.
If a channel word has as an ending: $-10^4$, the following substitutions can be applied on the next channel word:
$10^51-\rightarrow0^61-$ G.
If a channel word has as an ending: $-10^6$, the following substitutions can be applied on the next channel word:

$10^2 1 \text{-} \rightarrow 0^3 1 \text{-}$
$10^3 1 \text{-} \rightarrow 0^4 1 \text{-}$

H.

If a channel word has as an ending: $-10^7$, the following substitutions can be applied on the next channel word:
$10^2 1 \text{-} \rightarrow 0^3 1 \text{-}$

I.

If a channel word has as an ending: $-10^9$, the following substitutions can be applied on the next channel word:
$010^5 1 \text{-} \rightarrow 010^2 10^2 1 \text{-}$
, if the RMTR=6 constraint is not violated.

J.

If a channel word has as an ending: $-10^{10}$, the following substitutions can be applied on the next channel word:
$10^2 10^2 1 \text{-} \rightarrow 10^5 1 \text{-}$
$10^2 10^3 1 \text{-} \rightarrow 10^6 1 \text{-}$
$10^2 10^4 1 \text{-} \rightarrow 10^7 1 \text{-}$
$10^2 10^7 1 \text{-} \rightarrow 10^{10} 1 \text{-}$ For the main code $C_1$ only, we have as extra substitutions:

K.

$|10^2 10^5 10^4 x| \rightarrow |10^8 10^4 x|$

L.

$|10^2 10^6 10^2 xy| \rightarrow |10^9 10^2 xy|$

M.

If a channel word has as an ending: $-10^n$, the following substitutions can be applied on the next channel word:
$|0^2 10^2 10^7 10| \rightarrow |0^2 10^{10} 10|$
For $2 \leq n \leq 8$.

N.

$|0^5 10^2 10^5 x| \rightarrow |0^5 10^8 x|$

It must be stressed that whenever a possible substitution (under A up to O) violates the run length constraints (k=10, RMTR=6), the substitution is not performed.

In FIG. 6 is shown of how the next-state can be decoded for the channel words of the main code. In FIG. 7 is shown how the next-state can be decoded for the channel words of the dual code.

When decoding a channel word, either from the main code $C_1$ or from the dual code $C_2$, into an 8-bit information word, no knowledge of the current state is needed. Therefore, this decoding is called state-independent decoding. On the other hand, knowledge of the next-state is needed in order to be able to uniquely decode the channel words in the case of multiple occurrence of the given channel word. In fact, a code word is uniquely represented not only by the given channel word, but by the combination of channel word and next-state.

In FIGS. 6 and 7 it can be seen that, for determination of the next-state, a decoding window with a decoder look-ahead of a maximum of 12 bits and 14 bits into the next channel word must be performed, in case the next channel word is encoded with the main or dual code respectively. The entries in the tables of FIGS. 6 and 7 where this maximum decoder look-ahead is necessary are indicated with arrows. This decoder look-ahead must not be confused with the look-ahead encoding for improved DC-control. The asterisks in the FIGS. 6 and 7 indicate that all possible bit-combinations are allowed, as long as the imposed constraints are met.

When decoding the channel words into the information words, a so-called hashing-technique can be used, as will be explained below. Using this technique results in a reduced hardware complexity, i.e. a smaller number of gates, necessary to implement the decoder algorithm. We will describe one particular implementation in more detail. Decoding the channel words of the main code, using the hashing technique is performed as follows. Via enumerative decoding for d=2 the 15-bit channel word is converted into a 9-bit word by 15-to-9 mapping. Enumerative decoding is decoding in which the channel words to be decoded are computed by an algorithmic procedure based on the d=2 constraint instead of storing all the channel words in a table (for more information about enumerative coding refer to chapter 6 of the book "Codes for mass data storage systems", K. A. Schouhamer Immink, November 1999, Shannon Foundation Publishers, ISBN-90-74249-23-X). The number of the next-state is decoded via 2-bit coding in 2 bits because the maximum multiplicity of channel words equals 4. The 9-bit word and the 2-bit state word results in an 11-bit index. This 11-bit index is converted into the 8-bit information word with a hashing table for the main code, this hashing table comprising a table with at maximum 2048 entries ($=2^{11}$) (state-independent decoding).

When decoding the channel words of the dual code, the hashing technique is performed as follows. Via enumerative decoding for d=2 the 17-bit channel word is converted into a 10-bit word by 17-to-10 mapping. The number of the next-state is decoded via 2-bit coding in 2 bits. The 10-bit word and the 2-bit state word results in a 12-bit index. This 12-bit index is converted into the 8-bit information word with a hashing table for the dual code, this hashing table comprising one single table for all 6 states and both parities and 4096 entries ($=2^{12}$).

Figure 8:
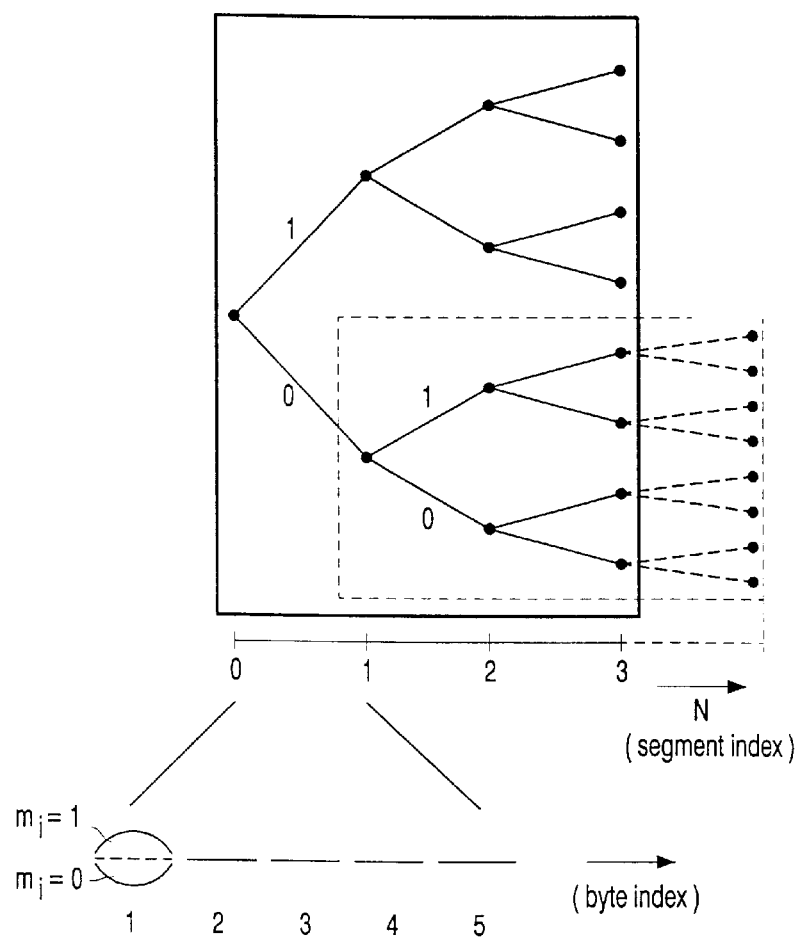
FIG. 8 shows a RDS-tree to be used for performing DC-control.

In FIG. 8 an RDS-tree to be used for performing DC-control is shown. RDS stands for the Running Digital Sum, which is a measure of the DC-content of the binary channel signal. As said before, for each $m_2$-bit channel word to be encoded, DC-control can be performed. In order to realize the most effective DC-control, it is advisable to "lookahead" in order to determine which choice of $m_2$-bit channel word, out of the two available $m_2$-bit channel words, results in the best RDS-value. As can be seen in FIG. 8, in order to be able to look-ahead N decisions, $2^N$ possible paths of the RDS-tree must be calculated. For N=3, 8 possible paths must be calculated. It is clear that the number of paths to be calculated is only depending on the number of $m_2$-bit channel words to be encoded; the number of $m_1$-bit channel words is not important as no additional paths are added when encoding an $m_1$-bit channel word.

Figure 9:
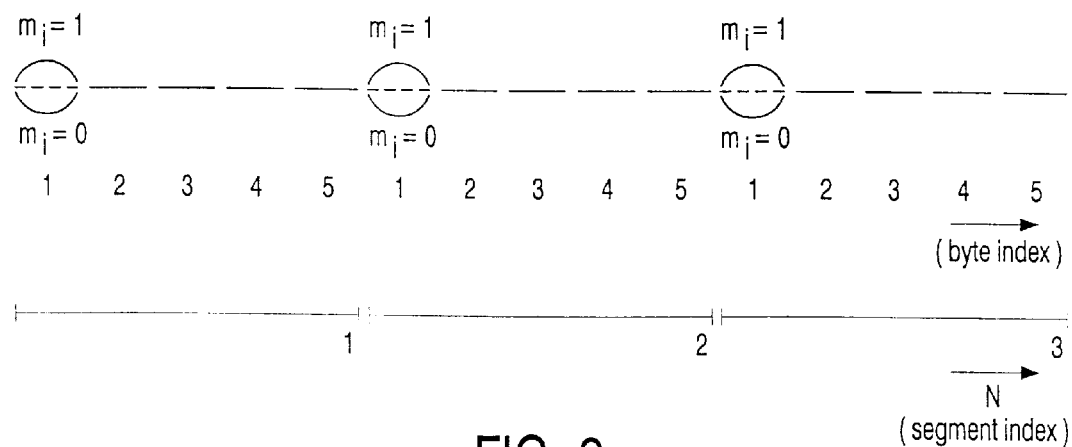
FIG. 9 shows the encoder path on a byte basis to be used for performing DC-control for realizing efficient look-ahead encoding.

FIG. 8 shows the decision tree with depth N, as it applies in general, i.e. both to the encoding along the distinct paths and to the evaluation criterion. FIG. 9 shows the encoding tree with largely reduced complexity, which becomes possible due to the "same-next-state" property of the dual code $C_2$. Although the RDS-criterion needs still to be evaluated along the distinct paths, the encoding of bytes with $C_1$ needs to be done only a single time, whereas bytes to be encoded with $C_2$, need, of course, to be encoded twice.

Consider a block of $N*n_B$ bytes, comprising N bytes related to a channel word of the dual code and comprising $N*(n_B-1)$ bytes related to channel words of the main code. It can be calculated that, in the case of the RDS-tree of FIG. 8, the number of bytes to be encoded in order to perform look-ahead DC-control is ($2^N*n_B$) bytes; It can similarly be calculated that, in the case of FIG. 9, the number of bytes to be encoded in order to perform look-ahead DC-control is $N*(n_B+1)$ bytes.

In conclusion, it is shown that, in order to realize efficient look ahead encoding for DC-control, the coding method according to the invention is arranged so that for each n-bit symbol, the two possible channel representations of code $C_2$ have the same next-state.

Figure 10:
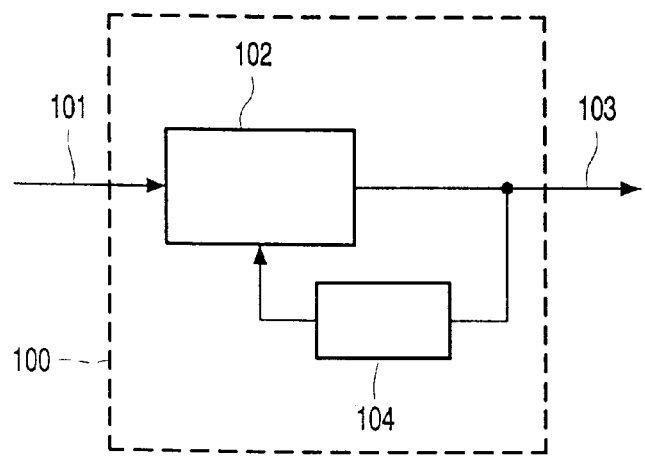
FIG. 10 shows a device for encoding according to the invention.

FIG. 10 shows a device for encoding according to the invention. In this encoding device 100, a stream of databits of a binary information signal 101 is converted into a stream of databits of a constrained binary channel signal 103. The encoding device 100 comprises a converter 102 for converting the n-bit information words into $m_1$-bit channel words and for converting the n-bit information words into $m_2$-bit channel words, in accordance with the coding method, for example in accordance with the code table of the main code $C_1$ and the dual code $C_2$ as shown in FIGS. 4 and 5. The encoding device 100 further comprises state-establishing means 104 for establishing a coding state of the $m_1$-bit channel words and of the $m_2$-bit channel words. Using this coding state, the converter 102 can convert the next n-bit information word.

Figure 11:
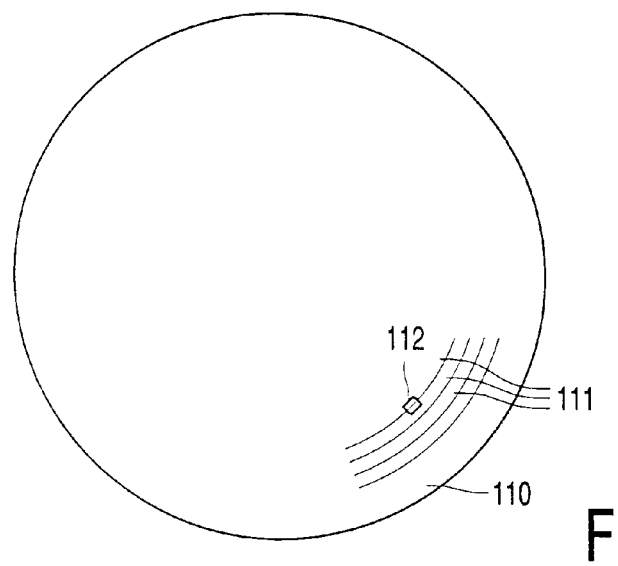
FIG. 11 shows a record carrier on which a signal comprising a stream of databits of a constrained binary channel signal, obtained after carrying out a method according to the invention is recorded in a track.
Figure 12:
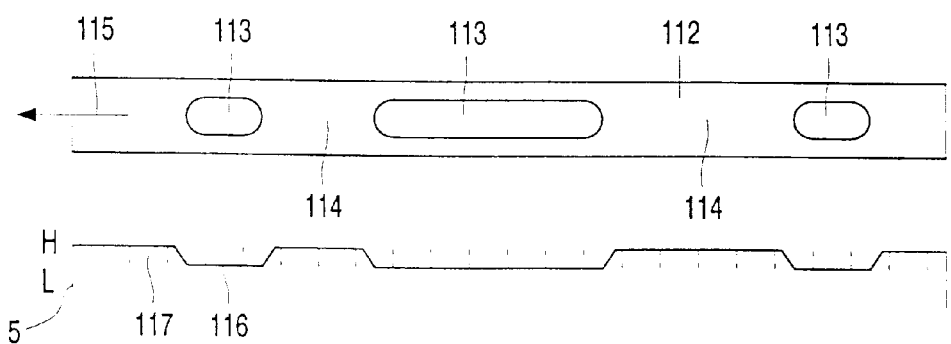
FIG. 12 shows an enlarged portion of the record carrier of FIG. 11.

FIG. 11 shows, by way of example, a record carrier 110 on which a signal comprising a stream of databits of a constrained binary channel signal, obtained after carrying out a method according to the invention is recorded in a track. FIG. 12 shows an enlarged portion of the record carrier of FIG. 11.

The record carrier shown is of an optically detectable type. The record carrier may also be of a different type, for example, a magnetically readable type. The record carrier comprises information patterns arranged in tracks 111. FIG. 12 shows an enlarged portion 112 of one of the tracks 111. The information pattern in the track portion 112 shown in FIG. 12 comprises first sections 113, for example, in the form of optically detectable marks and second sections 114, for example, intermediate areas lying between the marks. The first and second sections alternate in a direction of the track 115. The first sections 113 present first detectable properties and the second sections 114 present second properties which are distinguishable from the first detectable properties, The first sections 113 represent bit cells 116 of the modulated binary signal S having one signal level, for example the low signal level L. The second sections 114 represent bit cells 117 having the other signal level, for example the high signal level H. The record carrier 110 may be obtained by first generating the modulated binary channel signal and then providing the record carrier with the information pattern. If the record carrier is an optically detectable type, the record carrier can then be obtained by means of mastering and replica techniques known to a person skilled in the art.

Figure 13:
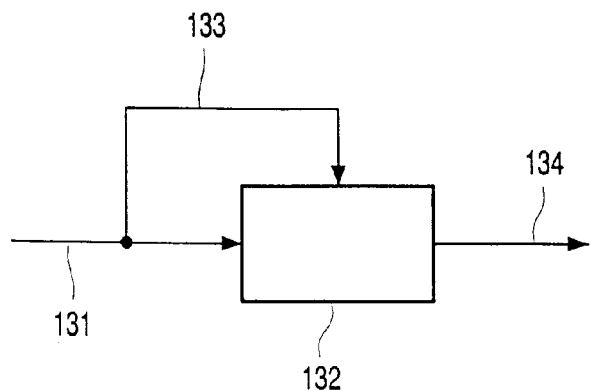
FIG. 13 shows a device for decoding according to the invention.

FIG. 13 shows a device for decoding. In this decoding device 132, a stream of databits of a constrained binary channel signal 131 is converted into a stream of databits of a binary information signal 134. The decoding device 132 comprises a converter for converting the constrained binary channel signal 131 into the stream of databits of a binary information signal. Decoding can be accomplished, for example, by using a hashing technique as described in and with reference to FIGS. 6 and 7. When decoding the binary channel signal 131, information about the next channel word to be decoded is needed, as is explained in and with reference to FIGS. 6 and 7. This information 133 is supplied to the decoding device 132 before decoding the present channel word.

Figure 14:
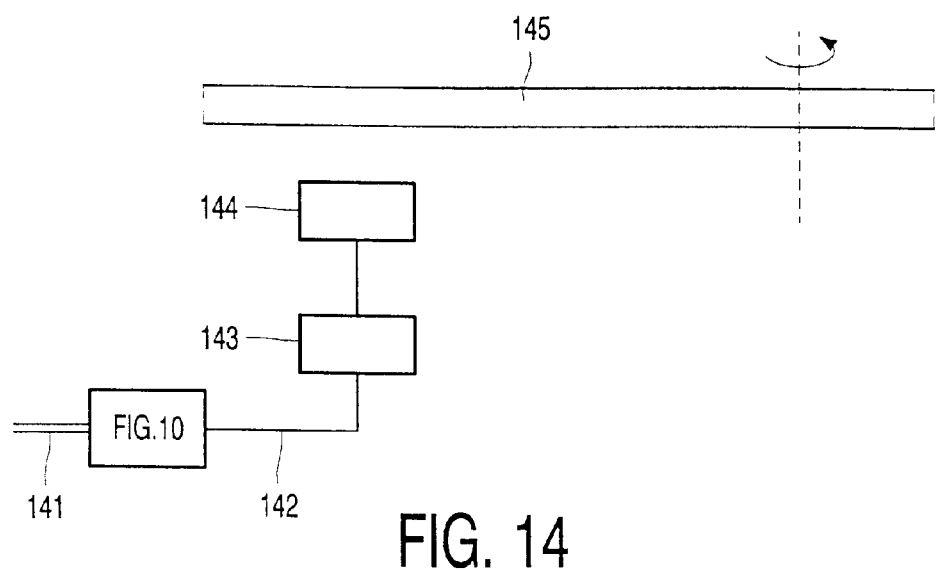
FIG. 14 shows a recording device according to the invention for recording information.

FIG. 14 shows a recording device for recording information. The Figure shows a recording device for recording information, in which the device for encoding according to the invention is used, for example the device for encoding 100 shown in FIG. 10. The signal line 141 supplies the information words to be encoded to the device for encoding 100. In the recording device the signal line 142 for supplying the modulated binary channel signal is connected to a control circuit 143 for a write head 144 along which a record carrier 145 of a writable type is moved. The write head 144 is of a customary type which is capable of introducing marks having detectable changes on the record carrier 145. The control circuit 143 may also be of a customary type generating a control signal for the write head in response to the modulated signal applied to the control circuit 143, so that the write head 144 introduces a pattern of marks that corresponds to the modulated signal.

Figure 15:
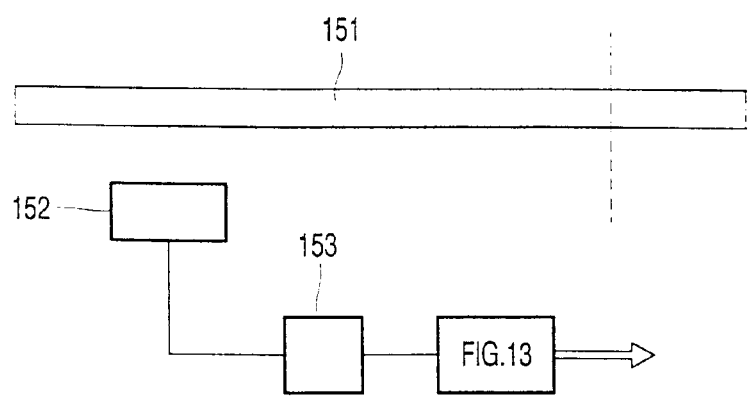
FIG. 15 shows a reading device according to the invention for reading out a record carrier.

FIG. 15 shows a reading device for reading out a record carrier. This Figure shows a reading device in which a device for decoding according to the invention is used, for example, the decoding device 132 shown in FIG. 13. The reading device comprises a read head 152 of a customary type for reading out a record carrier 151 according to the invention which record carrier 151 carries an information pattern that corresponds to the modulated binary channel signal according to the invention. The read head 152 then produces an analog read signal modulated in accordance with the information pattern read out by the read head 152. Detection circuit 153 converts this read signal in customary fashion into a binary signal, which is applied to the decoding circuit 132.

Whilst the invention has been described with reference to preferred embodiments therefor, it is to be understood that these are not limitative examples. Thus, various modifications may become apparent to those skilled in the art, without departing from the scope of the invention, as defined by the claims.

For example, instead of using one main code and one dual code, it is also possible to create a stream of channel words, without departing from the scope of the invention, by using a combination of more than one main code and/or more than one dual code. By appropriately mixing these codes, the constraints of the stream of channel words can still be complied with.

For example, the scope of the invention is not limited to a method of encoding an information word into one $m_1$-bit channel word followed by one $m_2$-bit channel word. The number of information words to be encoded into $m_1$-bit channel words before encoding an information word into a $m_2$-bit channel word is not prescribed.

For example, the scope of the invention is not limited to a binary code. Without deviating from the gist of the invention, the invention can be applied to multi-level codes, ternary codes or other M-ary codes. The number of different $m_2$-bit channel words for each n-bit information word must at least be two and in an advantageous situation, this number is equal to the number of values of the multivalued "parity"-parameter, while the "parities" of the channel words must at least cover all the different values at least once. In the case of a ternary code (with values −1, 0 and 1) this implies a that at least three different $m_2$-bit channel words with "parities" −1, 0 and 1 are present in the channel code $C_2$ (with the same next-state).

Furthermore, the invention reside in each and every novel characteristic feature or each and every combination of characteristic features.

What is claimed is:

1. A method of converting a stream of databits of a binary information signal into a stream of databits of a constrained binary channel signal, said method comprising converting each n-bit information word of a binary information signal into a channel word such that the binary channel signal includes a sequence of channel words:

wherein each said channel word is selected from the group consisting of an $m_1$-bit channel word in accordance with a channel code $C_1$ and an $m_2$-bit channel word in accordance with a channel code $C_2$, wherein n, $m_1$, and $m_2$ are positive integers such that $m_2 > m_1 > n$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein converting said n-bit information word into said $m_1$-bit channel word comprises selecting a set of $m_1$-bit channel words from a plurality of sets of $m_1$-bit channel words followed by selecting said $m_1$-bit channel word from said set of $m_1$-bit channel words, each set of $m_1$-bit channel words being associated with a coding state of said channel code $C_1$, said coding state of said channel code $C_1$ being established in dependence upon an end part of the preceding channel word in said sequence of channel words, wherein converting said information word into said $m_2$-bit channel word comprises selecting a set of $m_2$-bit channel words from a plurality of sets of $m_2$-bit channel words followed by selecting said $m_1$-bit channel word from said set of $m_2$-bit channel words, each set of $m_2$-bit channel words being associated with a coding state of said channel code $C_2$, said coding state of said channel code $C_2$ being established in dependence upon an end part of the preceding channel word in said sequence of channel words, and wherein end parts of the $m_1$-bit channel words in a coding state of channel code $C_1$ and beginning parts of the $m_2$-bit channel words in a coding state of channel code $C_2$ are arranged to comply with said runlength constraint.

2. The method of claim 1, wherein channel code $C_1$ and channel code $C_2$ have a same number of coding states.

3. The method of claim 1, wherein the end part of any $m_1$-bit channel word has a multiplicity $y_1$, the multiplicity $y_1$ being the number of different states of the channel code $C_1$ said end part may establish, and that the end part of any $m_2$-bit channel word has a multiplicity $y_2$, the multiplicity $y_2$ being the number of states of the channel code $C_2$ said end part may establish and in that $y_1 = y_2$ if the end part of the $m_1$-bit channel word is equal to the end part of the $m_2$-bit channel word.

4. The method of claim 1, wherein at least two $m_2$-bit channel words are associated with a same coding state.

5. The method of claim 1, wherein the sets of channel words of channel code $C_1$ and the sets of channel words of channel code $C_2$ are arranged that binary channel signals formed by the concatenated $m_1$-bit channel words and the $m_2$-bit channel words comply with a d=2 constraint and a k=10 constraint.

6. The method of claim 1, wherein the sets of channel words of channel code $C_1$ and the coding states of channel code $C_2$ are arranged that binary channel signals formed by the concatenated $m_1$-bit channel words and the $m_2$-bit channel words comply with a Repeated-Minimum-Runlength-Limitation=6 constraint on the binary channel signal.

7. The method of claim 1, wherein n=8, $m_1$=15, and $m_2$=17.

8. The method of claim 1, wherein a ratio of the number of $m_1$-bit channel words to the number of $m_2$-bit channel words is determined in dependence on a chosen measure of DC-control.

9. The method of claim 1, wherein the coding state relating to each channel word is further established in dependence upon the respective n-bit information word, wherein said respective n-bit information word may be distinguished from other n-bit information words by detecting the coding state.

10. The method of claim 1, further comprising substituting a new channel word for a first channel word, wherein the first channel word is derived from one of said n-bit information words, and wherein the new channel word is not derived from one of said n-bit information words.

11. A device for encoding a stream of databits of a binary information signal into a stream of databits of a constrained binary channel signal, said binary information signal comprising n-bit information words, said binary channel signal comprising a sequence of channel words, said sequence of channel words comprising $m_1$-bit channel words and $m_2$-bit channel words, the device comprising:

an n-to-$m_1$-bit converter for converting a first subset of said n-bit information words into corresponding $m_1$-bit channel words, an n-to-$m_2$-bit converter for converting a second subset of said n-bit information words into corresponding $m_2$-bit channel words, state-establishing means for establishing a coding state of the $m_1$-bit channel words and of the $m_2$-bit channel words, wherein the n-to-$m_1$ bit converter is additionally for selecting the $m_1$-bit channel word depending on an end part of the preceding channel word in said sequence of channel words, wherein the n-to-$m_2$ bit converter is additionally for selecting the $m_2$-bit channel word depending on an end part of the preceding channel word in said sequence of channel words, wherein n, $m_1$, and $m_2$ are positive integers such that $m_2 > m_1 > n$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein each $m_1$-bit channel word is associated with a coding state of a channel code $C_1$, said coding state of said channel code $C_1$ being established in dependence upon an end part of the preceding channel word in said sequence of channel words, wherein each $m_2$-bit channel word is associated with a coding state of a channel code $C_2$, said coding state of said channel code $C_2$ being established in dependence upon an end part of the preceding channel word in said sequence of channel words, and wherein end parts of the $m_1$-bit channel words in a coding state of channel code $C_1$ and beginning parts of the $m_2$-bit channel words in a coding state of channel code $C_2$ are arranged to comply with said runlength constraint.

12. The device of claim 11, wherein the device further comprises writing means for writing an information pattern on a record carrier, wherein the information pattern comprises databits of the stream of databits of the constrained binary channel signal.

13. A constrained binary channel signal, comprising a sequence of channel words:

wherein each said channel word is selected from the group consisting of an $m_1$-bit channel word in accordance with a channel code $C_1$ and an $m_2$-bit channel word in accordance with a channel code $C_2$, wherein $m_1$ and $m_2$ are positive integers such that $m_2>m_1$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein each $m_1$-bit channel word is associated with a coding state of said channel code $C_1$, said coding state of said channel code $C_1$ being established in dependence upon an end part of the preceding channel word in said sequence of channel words, wherein each $m_2$-bit channel word is associated with a coding state of said channel code $C_2$, said coding state of said channel code $C_2$ being established in dependence upon an end part of the preceding channel word in said sequence of channel words, and wherein end parts of the $m_1$-bit channel words in a coding state of channel code $C_1$ and beginning parts of the $m_2$-bit channel words in a coding state of channel code $C_2$ are arranged to comply with said runlength constraint.

14. A record carrier, comprising tracks having an information pattern recorded therein:

wherein the information pattern represents a portion of a constrained binary channel signal, wherein the information pattern comprises first parts and second parts alternating in the direction of a track of said tracks, wherein the first parts represent first bit cells of the binary channel signal such that the first bit cells have a low signal level, wherein the second parts represent first bit cells of the binary channel signal such that the first bit cells have a high signal level, wherein the portion of the constrained binary channel signal comprises a sequence of channel words, wherein each said channel word is selected from the group consisting of an $m_1$-bit channel word in accordance with a channel code $C_1$ and an $m_2$-bit channel word in accordance with a channel code $C_2$, wherein $m_1$ and $m_2$ are positive integers such that $m_2>m_1$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein each $m_1$-bit channel word is associated with a coding state of said channel code $C_1$, said coding state of said channel code $C_1$ being established in dependence upon an end part of the preceding channel word in said sequence of channel words, wherein each $m_2$-bit channel word is associated with a coding state of said channel code $C_2$, said coding state of said channel code $C_2$ being established in dependence upon an end part of the preceding channel word in said sequence of channel words, and wherein end parts of the $m_1$-bit channel words in a coding state of channel code $C_1$ and beginning parts of the $m_2$-bit channel words in a coding state of channel code $C_2$ are arranged to comply with said runlength constraint.

15. A device for decoding a stream of databits of a constrained binary channel signal into a stream of databits of a binary information signal that includes n-bit information words, the device comprising converting means for converting the constrained binary channel signal into the binary information signal:

wherein the binary information signal includes a sequence of channel words, wherein one of said n-bit information words is generated from each of said channel words, wherein each said channel word is selected from the group consisting of an $m_1$-bit channel word in accordance with a channel code $C_1$ and an $m_2$-bit channel word in accordance with a channel code $C_2$, wherein $m_1$ and $m_2$ are positive integers such that $m_2>m_1$, wherein at least two of said $m_2$-bit channel words have opposite parities, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, wherein each $m_1$-bit channel word is associated with a coding state of said channel code $C_1$, said coding state of said channel code $C_1$ being established in dependence upon an end part of the preceding channel word in said sequence of channel words, wherein each $m_2$-bit channel word is associated with a coding state of said channel code $C_2$, said coding state of said channel code $C_2$ being established in dependence upon an end part of the preceding channel word in said sequence of channel words, and wherein end parts of the $m_1$-bit channel words in a coding state of channel code $C_1$ and beginning parts of the $m_2$-bit channel words in a coding state of channel code $C_2$ are arranged to comply with said runlength constraint.

16. The device of claim 15, wherein the constrained binary channel signal is recorded as an information pattern on a record carrier, and wherein the device further comprises reading means for reading the information pattern from the record carrier to make the constrained binary channel signal available to the converting means.

17. A method of converting a stream of databits of a binary information signal into a stream of databits of a constrained binary channel signal, said method comprising converting each n-bit information word of a binary information signal into a channel word such that the binary channel signal includes a sequence of channel words:

wherein each said channel word is selected from the group consisting of an $m_1$-bit channel word in accordance with a channel code $C_1$ and an $m_2$-bit channel word in accordance with a channel code $C_2$, and wherein n, $m_1$, and $m_2$ are positive integers such that $m_2 > m_1 > n$.

18. The method of claim 17, wherein at least two of said $m_2$-bit channel words have opposite parities.

19. The method of claim 17, wherein said channel words are concatenated such that said sequence of channel words comprises said concatenated channel words, wherein said concatenated channel words comprise concatenated $m_1$-bit channel words and $m_2$-bit channel words, wherein said concatenated $m_1$-bit channel words and $m_2$-bit channel words comply with a runlength constraint of the binary channel signal, and wherein end parts of the $m_1$-bit channel words in a coding state of channel code $C_1$ and beginning parts of the $m_2$-bit channel words in a coding state of channel code $C_2$ are arranged to comply with said runlength constraint.

20. The method of claim 17, wherein converting said n-bit information word into said $m_1$-bit channel word comprises selecting a set of $m_1$-bit channel words from a plurality of sets of $m_1$-bit channel words followed by selecting said $m_1$-bit channel word from said set of $m_1$-bit channel words, each set of $m_1$-bit channel words being associated with a coding state of said channel code $C_1$, said coding state of said channel code $C_1$ being established in dependence upon an end part of the preceding channel word in said sequence of channel words, and wherein converting said information word into said $m_2$-bit channel word comprises selecting a set of $m_2$-bit channel words from a plurality of sets of $m_2$-bit channel words followed by selecting said $m_1$-bit channel word from said set of $m_2$-bit channel words, each set of $m_2$-bit channel words being associated with a coding state of said channel code $C_2$, said coding state of said channel code $C_2$ being established in dependence upon an end part of the preceding channel word in said sequence of channel words.

21. A device for encoding a stream of databits of a binary information signal into a stream of databits of a constrained binary channel signal, said binary information signal comprising n-bit information words, said binary channel signal comprising a sequence of channel words, said sequence of channel words comprising $m_1$-bit channel words and $m_2$-bit channel words, the device comprising:

an n-to-$m_1$-bit converter for converting a first subset of said n-bit information words into corresponding $m_1$-bit channel words, an n-to-$m_2$-bit converter for converting a second subset of said n-bit information words into corresponding $m_2$-bit channel words, state-establishing means for establishing a coding state of the $m_1$-bit channel words and of the $m_2$-bit channel words, and wherein n, $m_1$, and $m_2$ are positive integers such that $m_2 > m_1 > n$.

22. The method of claim 21, wherein the n-to-$m_1$ bit converter is additionally for selecting the $m_1$-bit channel word depending on an end part of the preceding channel word in said sequence of channel words, and wherein the n-to-$m_2$ bit converter is additionally for selecting the $m_2$-bit channel word depending on an end part of the preceding channel word in said sequence of channel words.

* * * * *